United States Patent
Ohki et al.

(10) Patent No.: US 8,829,569 B2
(45) Date of Patent: Sep. 9, 2014

(54) SEMICONDUCTOR APPARATUS HAVING FLUORINE CONTAINING REGION FORMED IN RECESSED PORTION OF SEMICONDUCTOR LAYER

(75) Inventors: Toshihiro Ohki, Kawasaki (JP); Hiroshi Endo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 196 days.

(21) Appl. No.: 13/290,420

(22) Filed: Nov. 7, 2011

(65) Prior Publication Data

US 2012/0146046 A1  Jun. 14, 2012

(30) Foreign Application Priority Data

Dec. 10, 2010  (JP) .................................. 2010-276381

(51) Int. Cl.
*H01L 29/778* (2006.01)
*H01L 29/423* (2006.01)
*H01L 29/66* (2006.01)
*H01L 29/20* (2006.01)

(52) U.S. Cl.
CPC ...... *H01L 29/66462* (2013.01); *H01L 29/4236* (2013.01); *H01L 29/2003* (2013.01); *H01L 29/7787* (2013.01)
USPC ..... 257/194; 257/201; 257/330; 257/E29.246

(58) Field of Classification Search
CPC .................................................. H01L 29/778
See application file for complete search history.

(56) References Cited

U.S. PATENT DOCUMENTS

| | | | | |
|---|---|---|---|---|
| 2007/0158692 A1* | 7/2007 | Nakayama et al. | ............ | 257/213 |
| 2010/0255646 A1* | 10/2010 | Suh et al. | ....................... | 438/172 |
| 2012/0056191 A1* | 3/2012 | Endo et al. | ....................... | 257/76 |
| 2012/0139630 A1* | 6/2012 | Ozaki et al. | ................... | 330/250 |

FOREIGN PATENT DOCUMENTS

| | | |
|---|---|---|
| CN | 101246902 | 8/2008 |
| CN | 101465372 | 6/2009 |
| JP | 2002-359256 A1 | 12/2002 |

OTHER PUBLICATIONS

R. Wang et al.,"Integration of enhancement and depletion-mode AlGaN/GaN MIS-HFETs by fluoride-based plasma treatment", Phys. Stat. Sol., vol. 204, Issue 6, pp. 2023-2027, May 2007.
Office Action of Chinese Patent Application 201110352602.X dated Dec. 18, 2013 with Partial English Translation.

\* cited by examiner

*Primary Examiner* — Stephen W Smoot
(74) *Attorney, Agent, or Firm* — Kratz, Quintos & Hanson, LLP

(57) ABSTRACT

A semiconductor apparatus includes a first semiconductor layer formed on a substrate, a second semiconductor layer formed on the first semiconductor layer, a gate recess formed by removing at least a portion of the second semiconductor layer, an insulation film formed on the gate recess and the second semiconductor layer, a gate electrode formed on the gate recess via the insulation film, source and drain electrodes formed on one of the first and the second semiconductor layers, and a fluorine containing region formed in at least one of a part of the first semiconductor layer corresponding to a region in which the gate recess is formed and a part of the second semiconductor layer corresponding to the region in which the gate recess is formed.

8 Claims, 23 Drawing Sheets

——— 6A  F INJECTIOIN ONLY  Vth: 0.46V

----- 6B  GATE RECESS ONLY  Vth: 0.93V

——— 6C  FIRST EMBODIMENT
(GATE RECESS + F INJECTION)  Vth: 3.03V

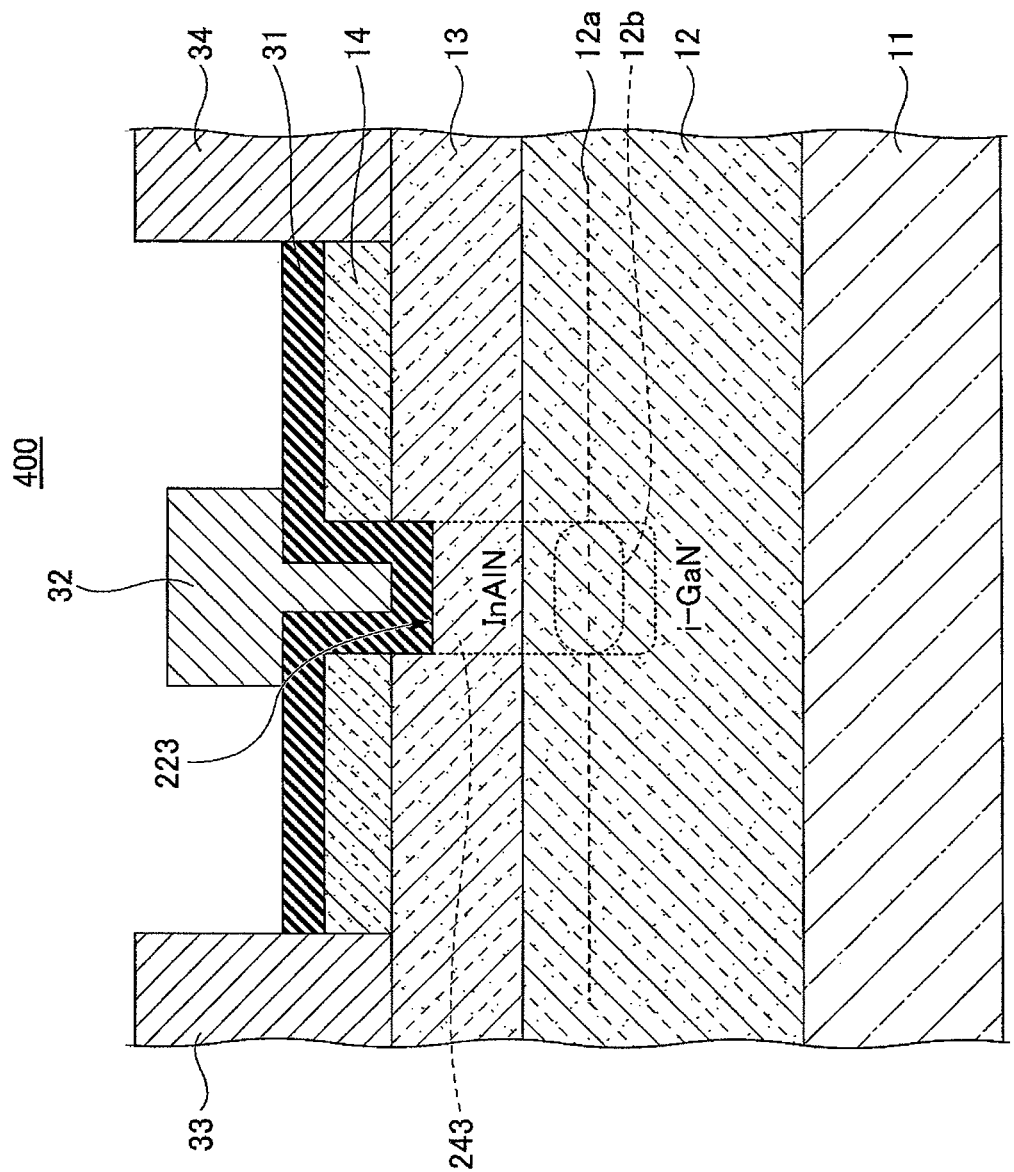

SEMICONDUCTOR APPARATUS HAVING FLUORINE CONTAINING REGION FORMED IN RECESSED PORTION OF SEMICONDUCTOR LAYER

CROSS-REFERENCE TO RELATED APPLICATIONS

This application is based upon and claims the benefit of priority of the prior Japanese Patent Application No. 2010-276381 filed on Dec. 10, 2010, the entire contents of which are incorporated herein by reference.

FIELD

The embodiments discussed herein are related to a semiconductor apparatus and a method for manufacturing the semiconductor apparatus.

BACKGROUND

Nitride semiconductors such as GaN, AlN, InN or a mixed crystal thereof have wide band gaps and are used for high output electronic devices and short wavelength light emitting devices. Among the high output electronic devices, technologies for FET (Field Effect Transistor, particularly, HEMT (High Electron Mobility Transistor) are being developed (see, for example, Japanese Laid-Open Patent Publication No. 2002-359256). A HEMT using a nitride semiconductor is used for high output/high efficiency amplifiers, high power switching devices, and the like.

The HEMT used for such devices is required to have characteristics such as "normally-off" and high insulation resistance. From the standpoint of safety, the normally-off characteristic is significant for the HEMT. Various methods for attaining the normally-off characteristic are being considered. One method for attaining the normally-off characteristic is to form a gate recess by removing a portion of a semiconductor layer immediately below a gate electrode (gate recess structure). The gate recess structure has advantages such as making a threshold voltage positive without increasing resistance components in-between electrodes. Furthermore, MIS (Metal Insulator Semiconductor) structures, which include an insulating film used as the gate insulator, are used for horizontal type FETs or HEMTs because high drain resistance and high gate resistance are required for normally-off semiconductor devices used for electric power purposes. Accordingly, by combining the gate recess structure and the MIS structure in an HEMT including a GaN type semiconductor material, the HEMT can be used as a semiconductor device suitable for electric power purposes.

In a case where a GaN type semiconductor material is used in the HEMT having a MIS structure, the GaN type semiconductor material exhibits a strong piezo polarization and spontaneous polarization and has an extremely high electron density in the semiconductor layer (electron transit layer). Therefore, the threshold voltage may not shift much toward the positive even by forming a gate recess in the HEMT. Thus, the HEMT may not be able to attain a normally-off characteristic by merely forming the gate recess.

Further, in a case of manufacturing HEMTs where the gate recesses are formed by dry-etching with a gas containing a chlorine component, the depths of the gate recesses become inconsistent. This leads to inconsistent characteristics and low yield of the manufactured HEMTs. Further, the bottom surface of the gate recess tends to become bumpy (concavo-convexo) by using the dry-etching method. This causes electrons to be unexpectedly captured in the trap level. Thus, when electrons are captured in the trap level, the threshold voltage changes. As a result, it becomes difficult for the HEMTs to attain steady operating characteristics.

SUMMARY

According to an aspect of the invention, there is provided a semiconductor apparatus including: a first semiconductor layer formed on a substrate; a second semiconductor layer formed on the first semiconductor layer; a gate recess formed by removing at least a portion of the second semiconductor layer; an insulation film formed on the gate recess and the second semiconductor layer; a gate electrode formed on the gate recess via the insulation film; source and drain electrodes formed on one of the first and the second semiconductor layers; and a fluorine containing region formed in at least one of a part of the first semiconductor layer corresponding to a region in which the gate recess is formed and a part of the second semiconductor layer corresponding to the region in which the gate recess is formed.

The object and advantages of the invention will be realized and attained by means of the elements and combinations particularly pointed out in the claims.

It is to be understood that both the foregoing generation description and the followed detailed description are exemplary and explanatory and are not restrictive of the invention as claimed.

BRIEF DESCRIPTION OF DRAWINGS

FIG. 15 is a schematic diagram illustrating a semiconductor apparatus according to a fourth embodiment of the present invention;

DESCRIPTION OF EMBODIMENTS

First Embodiment (Semiconductor Apparatus)

Figure 1:
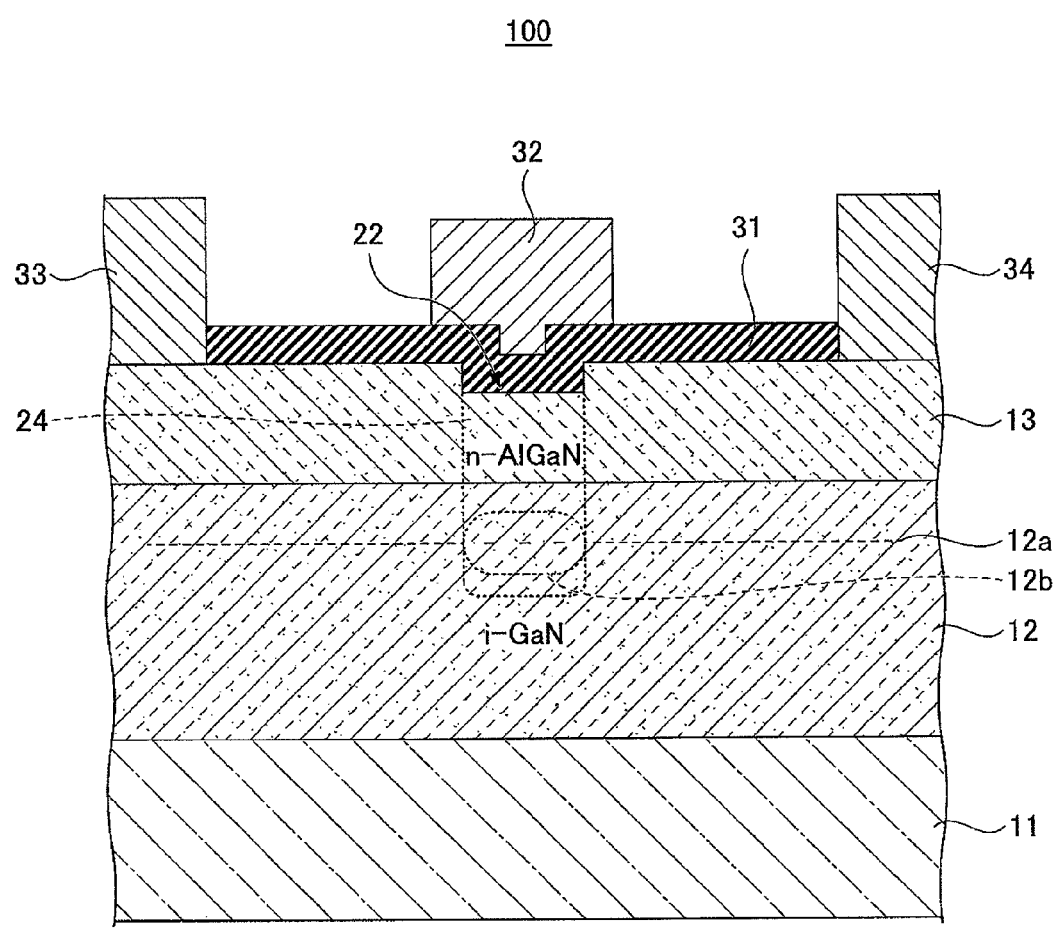
FIG. 1 is a schematic diagram illustrating a semiconductor apparatus according to a first embodiment of the present invention.

A semiconductor apparatus 100 according to the first embodiment of the present invention is described with reference to FIG. 1. FIG. 1 is a schematic diagram illustrating the semiconductor apparatus 100 according to the first embodiment of the present invention. The semiconductor apparatus 100 has a semiconductor layer including an electron transmit layer 12 and an electron supply layer 13 sequentially formed on a substrate 11. The substrate 11 is formed of a semi-insulating material such as SiC. The electron transmit layer (which is to be a first semiconductor layer) 12 is formed of, for example, i-GaN. The electron supply layer (which is to be a second semiconductor layer) 13 is formed of, for example, n-AlGaN. Accordingly, a two-dimensional electron gas (2DEG) layer 12a is formed in the electron transmit layer 12 at the vicinity of the interface between the electron transmit layer 12 and the electron supply layer 13. A gate recess 22 is formed in, for example, the electron supply layer 13. A region 24 containing fluorine (F) (hereinafter also referred to as "fluorine containing region 24") is formed in, for example, a part of the electron transit layer 12 and/or a part of the electron supply layer 13 that correspond to the region in which the gate recess 22 is formed. Further, an insulation film (which is to be a gate insulation film) 31 is formed on the gate recess 22 and the electron supply layer 13. A gate electrode 32 is formed on the region where the gate recess 22 is formed via the insulation film 31. Further, a source electrode 33 and a drain electrode 34 are formed on predetermined regions of the electron supply layer 13. Alternatively, the source electrode 33 and the drain electrode 34 may be formed on predetermined regions of the electron transit layer 12. Further, although the fluorine containing region 24 may be formed solely in the electron supply layer 13, it is preferable to form the fluorine containing region 24 in both the electron supply layer 13 and the electron transit layer 12 for attaining the below-described effects.

As described above, the fluorine containing region 24 is formed in, for example, a part of the electron transit layer 12 and/or a part of the electron supply layer 13 that corresponds to the region in which the gate recess 22 is formed. Fluorine (F) has the highest electronegativity among chemical elements and easily becomes anionic. When the fluorine in the fluorine containing region 24 become anionic, electrons in the part of the 2DEG layer 12a corresponding to the fluorine containing region 24 are reduced in number. Thereby, a region 12b with few electrons (hereinafter also referred to as "low electron region 12b") is formed in the part of the 2DEG layer 12a. Because the low electron region 12b is directly below the region where the gate electrode 32 is formed, the low electron region 12b together with the gate recess 22 create a synergy effect that enables a HEMT including GaN type semiconductor material to attain a normally-off characteristic.

(Method for Manufacturing Semiconductor Apparatus)

Next, a method for manufacturing a semiconductor apparatus according to the first embodiment of the present invention is described with reference to FIGS. 2A-4B.

Figure 2A:
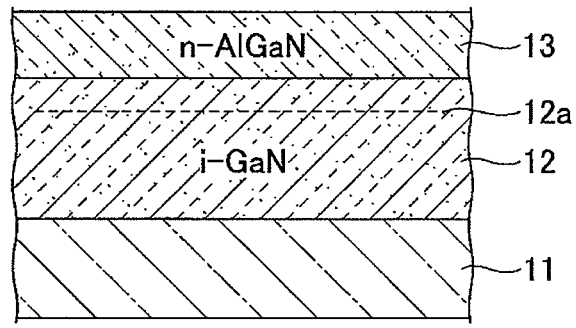
FIGS. 2A-4B are schematic diagrams for describing a method for manufacturing a semiconductor apparatus according to the first embodiment of the present invention.

As illustrated in FIG. 2A, the electron transit layer (first semiconductor layer) 12 and the electron supply layer (second semiconductor layer) 13 are sequentially formed on the substrate 11 formed of a semi-insulating material (e.g., SiC). In this embodiment, the electron transit layer 12 and the electron supply layer 13 are formed by epitaxial growth based on Metalorganic vapour phase epitaxy (MOVPE). It is to be noted that, in this embodiment, the electron transit layer 12 is formed with i-GaN having a thickness of approximately 3 μm. Further, the electron supply layer 13 is formed with n-AlGaN having a thickness of approximately 30 nm. The electron supply layer 13 is doped with an impurity element such as Si, so that the impurity concentration of the electron supply layer 13 is $5 \times 10^{18}\,cm^{-3}$. Thereby, the 2DEG layer 12a is formed in the electron transit layer 12 at the vicinity of the interface between the electron transit layer 12 and the electron supply layer 13. Then, although not illustrated in the drawings, an element separation region is formed. In forming the element separation region, first, a photoresist is coated on a predetermined region(s) of the surface of the layered configuration. Then, the photoresist is developed by being exposed with an exposing device. Thereby, a resist pattern is formed having an opening at a region where the element separation region is to be formed. Then, the element separation region can be obtained by forming an insulation film or by injecting ions containing a predetermined chemical element in a dry-etched region. A gas containing a chlorine component is used for forming the dry-etched region.

Figure 2B:
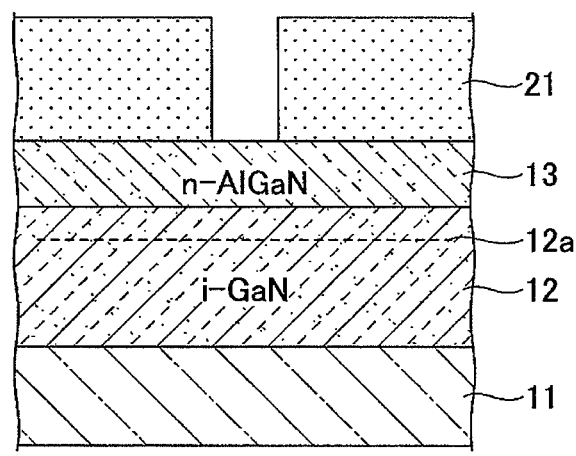

Then, as illustrated in FIG. 2B, a resist pattern 21 is formed on the surface of the electron supply layer 13. The resist pattern 21 is formed by coating photoresist on the surface of the electron supply layer 13 and developing the photoresist by exposing the photoresist with an exposing device. Thereby, the resist pattern 21 can be formed having an opening(s) formed in a region where the gate recess 22 is to be formed.

Figure 2C:
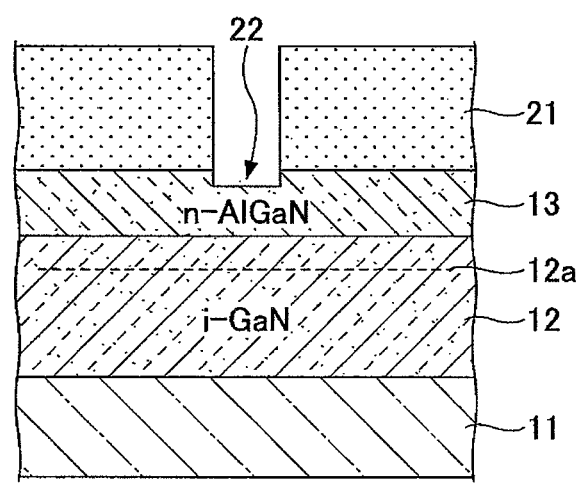

Then, as illustrated in FIG. 2C, a part of or all of the electron supply layer 13 having no resist pattern 21 formed thereon is removed by dry etching (e.g., RIE (Reactive Ion Etching)). Thereby, the gate recess 22 is formed. The etching gas used in the dry etching contains a mixture of a chlorine type gas (gas containing a chlorine component) and a fluorine type gas (gas containing a fluorine component) that are mixed by being guided into a dry-etching chamber of a dry-etching apparatus. The gas containing a chlorine component may be, for example, $Cl_2$, $BCl_3$, or $SiCl_4$. The gas containing a fluorine component may be, for example, $SF_6$, $CF_4$, $C_2F_6$, $C_3F_8$, $CHF_3$, $NF_3$, or $F_2$. By adding the gas containing a fluoride component in the etching gas, the etching rate becomes low compared to the etching rate where the gas containing a chlorine component is used as the etching gas. As a result, etching can be evenly (uniformly) performed. Thus, control of the etching process can be improved and the etching surface can be flat. Thereby, the depth of the gate recess 22 can be uniform and the bottom surface of the gate recess 22 can be flat. In this embodiment, the gate recess 22 is formed by guiding an etching gas containing $Cl_2$ of 20 sccm and $SF_6$ of 10 sccm into the etching chamber, setting the pressure inside the etching chamber to 2 Pa, and performing RIE with RF (Radio Frequency) power of 20 W.

Figure 3A:
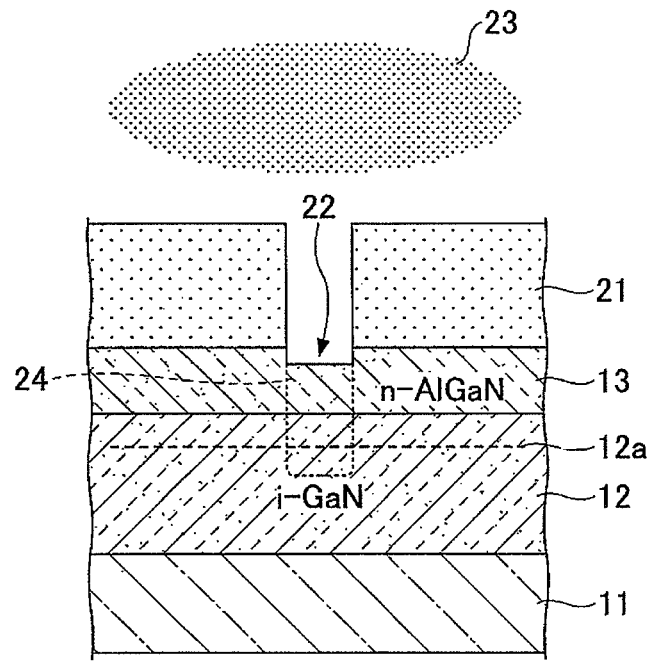

Then, as illustrated in FIG. 3A, fluorine is injected into the part of the electron transit layer 12 and the part of the electron supply layer 13 that correspond to the region in which the gate recess 22 is formed by performing a plasma process using fluorine (i.e. exposure of fluoride plasma). More specifically, the plasma process is performed by guiding a gas containing a fluorine component (e.g., $C_3F_8$, $CHF_3$, $NF_3$, or $F_2$) into the etching chamber of the above-described dry-etching apparatus (used for RIE) and generating fluoride plasma 23 by applying predetermined RF power. Thereby, the fluorine containing region 24 is formed in the part of the electron transit layer 12 and the part of the electron supply layer 13 that correspond to the region in which the gate recess 22 is formed. The forming of the fluorine containing region 24 causes reduction of the number of electrons in the part of the 2DEG layer 12a directly below the region in which the gate recess 22 is formed. In this embodiment, the fluorine containing region 24 is formed by guiding an etching gas containing $CF_4$ of 30 sccm into the etching chamber, setting the pressure inside the etching chamber to 2 Pa, and generating fluoride plasma 23 by applying RF (Radio Frequency) power of 200 W. Because self-bias is created when RF power is being applied, ionized fluorine is drawn toward and injected into the part of the electron transit layer 12 and the part of the electron supply layer 13 that correspond to the region in which the gate recess 22 is formed. Thereby, the fluorine containing region 24 can be formed. Alternatively, a separate bias may be applied for injecting more fluorine into the part of the electron transit layer 12 and the part of the electron supply layer 13 that correspond to the region in which the gate recess 22 is formed. In order to efficiently form the fluorine containing region 24, the RF power applied in the plasma process is preferred to be higher than the RF power applied for forming the gate recess 22. Although this embodiment describes the fluorine containing region 24 formed by generating fluoride plasma 23, the fluorine containing region 24 may be formed by other methods (e.g., fluorine ion injection).

The dry-etching process (e.g., RIE) of FIG. 2C and the plasma process of FIG. 3A are preferred to be performed in the same etching chamber. It is more preferable to consecutively perform the dry-etching process of FIG. 2C and the plasma process of FIG. 3A so that the plasma process of FIG. 3A can be performed without the plasma generated by the dry-etching run out in the chamber (i.e. a state where the plasma generated in the dry-etching process still remains in the chamber). The dry-etching process of FIG. 2C can be consecutively switched to the plasma process of FIG. 3A by controlling, for example, the type of gas guided into the etching chamber and the amount of gas guided into the etching chamber. By consecutively switching from the dry-etching process of FIG. 2C to the plasma process of FIG. 3A, contaminants or foreign material can be prevented from adhering to the surface of the gate recess 22 after the dry-etching process of FIG. 2C.

Figure 3B:
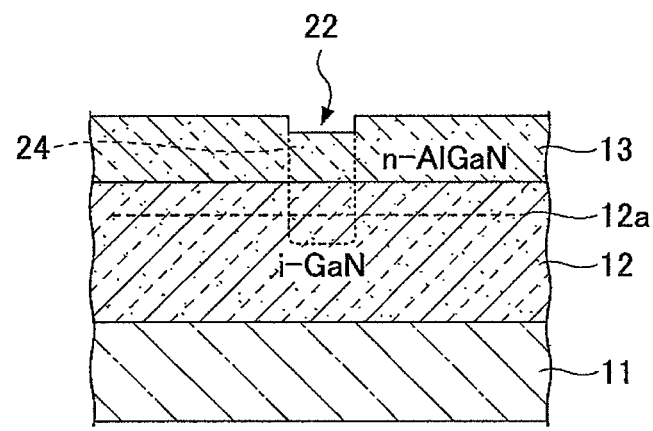

Then, as illustrated in FIG. 3B, the resist pattern 21 is removed by using, for example, an organic solvent.

Figure 3C:
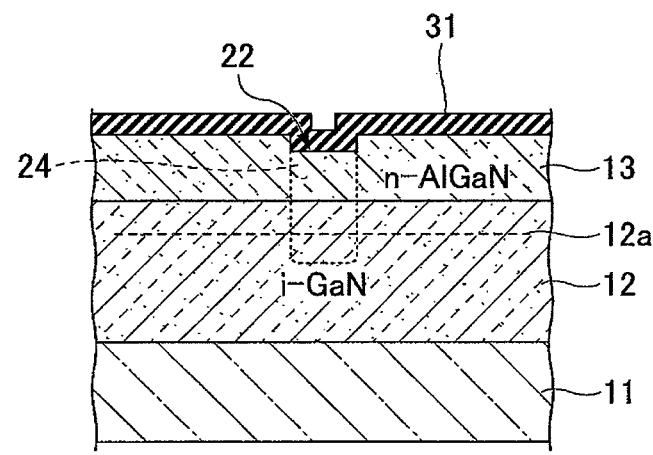

Then, as illustrated in FIG. 3C, the insulation film 31 is formed on the gate recess 22 and the electron supply layer 13. The insulation film 31 is to serve as a gate insulation film. In this embodiment, the insulation film 31 is formed by depositing an aluminum oxide film ($Al_2O_3$) having a thickness of 2 nm-200 nm. More specifically, the insulation film 31 is formed by depositing an aluminum oxide film having a thickness of approximately 10 nm. The method of depositing the insulation film 31 may be, for example, CVD (Chemical Vapor Deposition), ALD (Atomic Layer Deposition), or sputtering.

It is to be noted that the insulation layer 31 may be formed with a material other than aluminum oxide. For example, an oxide, a nitride, or an oxynitride of Si, Al, Hf, Zr, Ti, Ta, or W may be used to form the insulation layer 31.

Figure 4A:
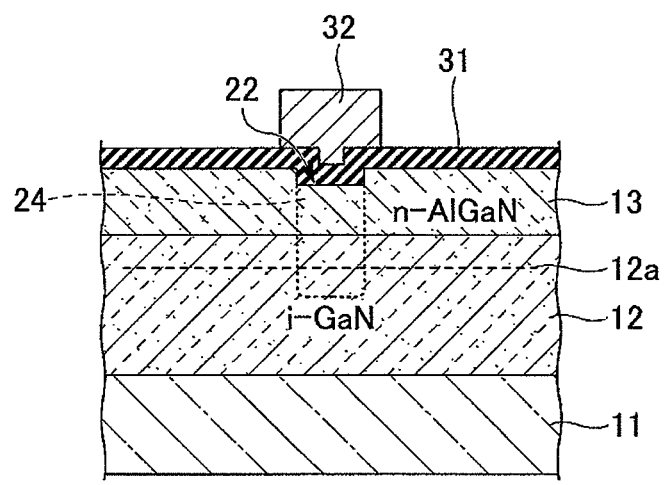

Then, as illustrated in FIG. 4A, the gate electrode 32 is formed on the region where the gate recess 22 is formed via the insulation film 31. More specifically, although not illustrated in the drawings, a resist pattern having an opening at a region where the gate electrode 32 is to be formed is formed by applying photoresist on the insulation film 31 and developing the photoresist by exposing the photoresist with an exposing device. Then, a metal film is formed by sequentially depositing a Ni film having a thickness of approximately 30 nm and an Au film having a thickness of approximately 400 nm. The Ni film and the Au film are deposited by vacuum deposition. Then, the metal film on the resist pattern is removed together with the resist pattern by performing lift-off using an organic solvent or the like. Thereby, the metal film deposited on a region having no resist pattern formed thereon remains on the insulation film 31 and the gate recess 22. Accordingly, the remaining metal film becomes the gate electrode 32.

Figure 4B:
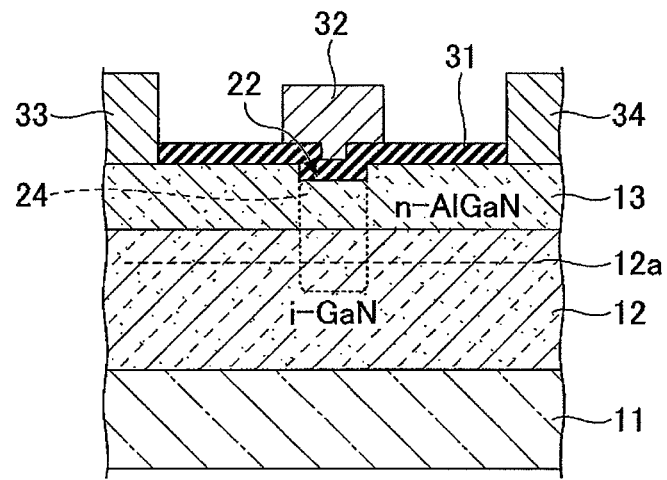

Then, as illustrated in FIG. 4B, the source electrode 33 and the drain electrode 34 are formed. More specifically, a resist pattern (not illustrated) having openings at regions where the source and drain electrodes 33, 34 are to be formed are formed by applying photoresist on the surface of the insulation film 31 and developing the photoresist by exposing the photoresist with an exposing device. Then, the insulation film 31 is removed from a region having no resist pattern formed thereon by performing dry etching (e.g., RIE) using a gas containing a chlorine component. Thereby, opening regions are formed on the insulation film 31. Then, the resist pattern is removed. Then, a resist pattern (not illustrated) having openings at regions where the source and drain electrodes 33, 34 are to be formed are formed by applying photoresist on, for example, the surface of the insulation film 31 and developing the photoresist by exposing the photoresist with an exposing device. Then, a metal film is formed by sequentially depositing a Ta film having a thickness of approximately 20 nm and an Al film having a thickness of approximately 200 nm. The Ta film and the Al film are deposited by vacuum deposition. Then, the metal film on the resist pattern is removed together with the resist pattern by performing lift-off using an organic solvent or the like. Thereby, the metal film deposited on regions having no resist pattern formed thereon remains on the electron supply layer 13. Accordingly, the remaining metal film becomes the source electrode 33 and the drain electrode 34. Then, a thermal process is performed on the source electrode 33 and the drain electrode 34 at a temperature of 400° C. to 1000° C. (e.g., 550° C.). Thereby, ohmic contact is established between the source electrode 33 and the drain electrode 34. It is to be noted that, although resist patterns are formed twice in the above-described embodiment, the resist pattern for forming the opening regions of the insulation film 31 can also be used as the resist pattern for forming the source electrode 33 and the drain electrode 34. In this case, the resist pattern need only be formed once.

Hence, with the above-described embodiment of the method for manufacturing a semiconductor apparatus, the semiconductor apparatus 100 can be obtained. The semiconductor apparatus 100 manufactured by the above-described embodiment of the method for manufacturing a semiconductor apparatus attains a normally-off characteristic by having the fluorine containing region 24 formed in a part of, for example, the electron supply layer (n-AlGaN layer, second semiconductor layer) corresponding to the region where the gate recess 22 is formed. Further, the etching rate can be lowered by adding a gas containing a fluorine component to the gas used for etching. Thereby, etching can be uniformly performed on the etching target. That is, the gate recess 22 can be formed having a uniform depth and a flat bottom surface. Accordingly, the yield of the semiconductor apparatus 100 can be improved and attain a steady operating characteristic.

The above-described embodiment of the configuration of the semiconductor apparatus 100 can be applied to any structure as long as it is a FET (Field Effect Transistor) including a gate recess and a gate insulation film. The method of forming the gate electrode, the source electrode, and the drain electrode is not limited to the method described above. Further, as long as ohmic contact can be established, methods other than thermal processing can be used for establishing ohmic contact. Further, the thermal process may be performed after the forming of the gate electrode.

Figure 5:
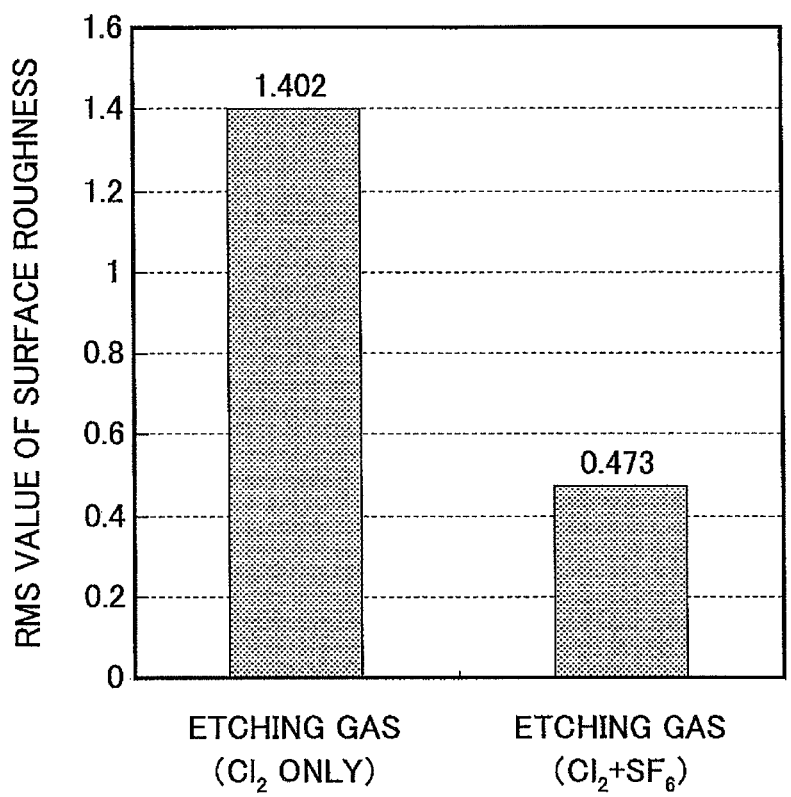
FIG. 5 is a graph for describing a RMS of surface roughness with respect to different etching gases.

As described above with reference to FIG. 2C, the gate recess 22 is formed by dry etching (e.g., RIE). In the following, the relationship between the etching gas and the surface roughness of the bottom surface of the gate recess 22 is described. FIG. 5 is a graph illustrating the surface roughness of a bottom surface of a gate recess in a case of forming the gate recess by using chlorine as the etching gas for performing RIE (first case) and a case of forming a gate recess by using a combination of chlorine and sulfur hexafluoride as the etching gas for performing RIE (second case). The Root Mean Square (RMS) of the surface roughness of the bottom surface in the first case is 1.402 whereas the RMS of the surface roughness of the bottom surface in the second case is 0.473. Thus, the bottom surface of the gate recess formed in the second case can be smoother compared to that of the first case.

Figure 6:
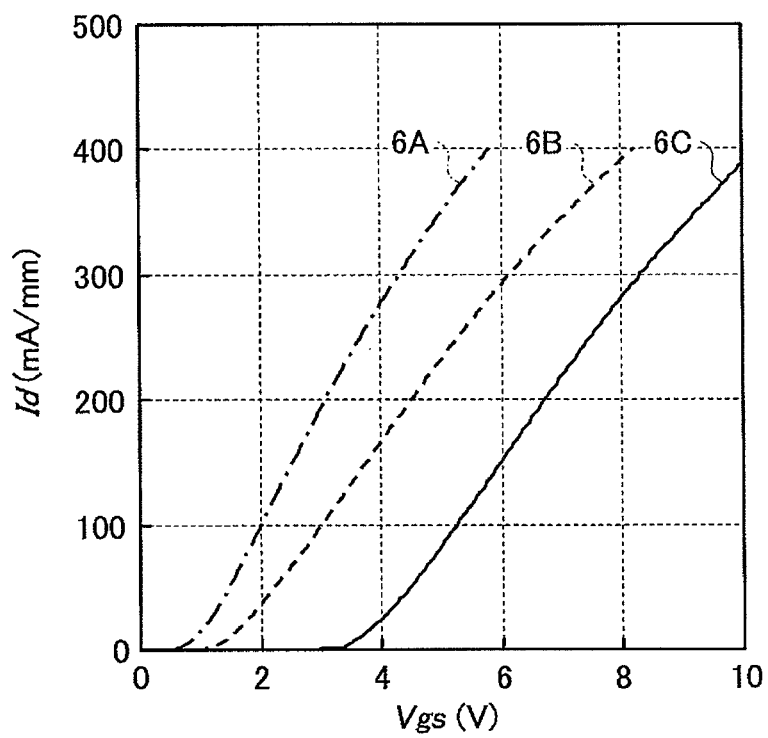
FIG. 6 is a graph for describing a relationship between a gate/source voltage and a drain current according to an embodiment of the present invention.

In the following, the relationship between the gate/source voltage Vgs and the drain current Id according to an embodiment of the present invention is described with reference to FIG. 6. The dash-dot line 6A in FIG. 6 represents a case of manufacturing a semiconductor apparatus where fluorine injection is performed but not forming a gate recess. In the case of the dash-dot line 6A, the threshold voltage Vth of the gate/source voltage Vgs of the semiconductor apparatus is approximately 0.46 V. The broken line 6B in FIG. 6 represents a case of manufacturing a semiconductor apparatus where a gate recess is formed but not performing fluorine injection. In the case of the broken line 6B, the threshold voltage Vth of the gate/source voltage Vgs of the semiconductor apparatus is approximately 0.93 V. On the other hand, the solid line 6C in FIG. 6 represents a case of manufacturing a semiconductor apparatus where fluorine injection is performed and a gate recess is formed. In the case of the solid line 6C, the threshold voltage Vth of the gate/source voltage Vgs of the semiconductor apparatus is approximately 3.03. Accordingly, the semiconductor apparatus according to the above-described embodiment of the present invention can significantly shift the threshold voltage Vth toward a positive direction.

Second Embodiment

Semiconductor Apparatus

Figure 7:
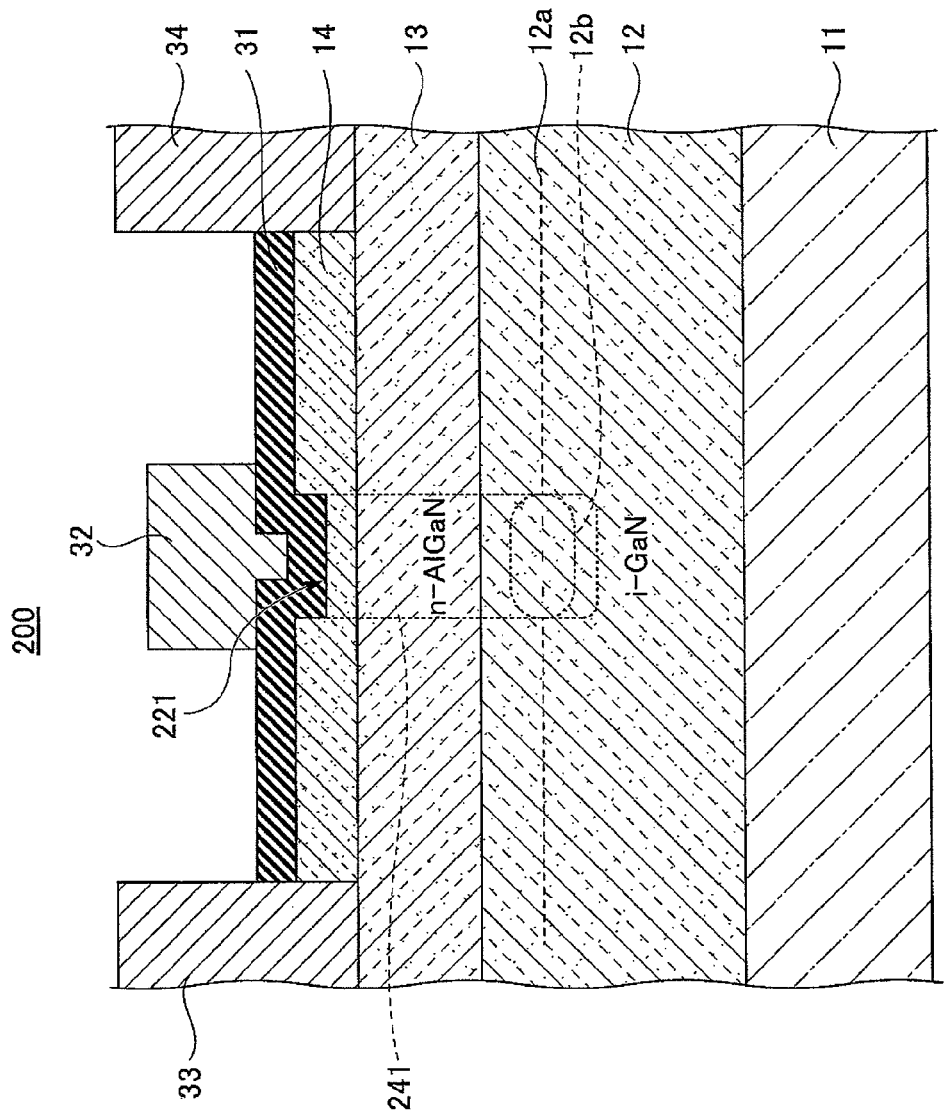
FIG. 7 is a schematic diagram illustrating a semiconductor apparatus according to a second embodiment of the present invention.

A semiconductor apparatus 200 according to the second embodiment of the present invention is described with reference to FIG. 7. In the second embodiment, like components are described with like reference numerals as those of the first embodiment and are not further described. FIG. 7 is a schematic diagram illustrating the semiconductor apparatus 200 according to the second embodiment of the present invention. The semiconductor apparatus 200 has semiconductor layers including the electron transmit layer 12, the electron supply layer 13, and a cap layer 14 sequentially formed on the substrate 11. The substrate 11 is formed of, for example, Si. The electron transmit layer (which is to be a first semiconductor layer) 12 is formed of, for example, i-GaN. The electron supply layer (which is to be a second semiconductor layer) 13 is formed of, for example, n-AlGaN. Accordingly, the two-dimensional electron gas (2DEG) layer 12a is formed in the electron transmit layer 12 at the vicinity of the interface between the electron transmit layer 12 and the electron supply layer 13. The gate recess 221 is formed in, for example, the cap layer 14. A region 241 containing fluorine (F) (hereinafter also referred to as "fluorine containing region 241") is formed in, for example, a part of the electron transit layer 12, a part of the electron supply layer 13, and a part of the cap layer 14 that correspond to the region in which the gate recess 221 is formed. Further, the insulation film (which is to be the gate insulation film) 31 is formed on the gate recess 221 and the cap layer 14. The gate electrode 32 is formed on the region where the gate recess 221 is formed via the insulation film 31. Further, the source electrode 33 and the drain electrode 34 are formed on predetermined regions of the electron supply layer 13. Alternatively, the source electrode 33 and the drain electrode 34 may be formed on predetermined regions of the electron transit layer 12.

With the semiconductor apparatus 200 according to the second embodiment, the fluorine containing region 241 is formed at the part of the cap layer 14, the part of the electron supply layer 13, and the part of the electron transit layer 12 that correspond to the region in which the gate recess 221 is formed. Fluorine (F) has the highest electronegativity among chemical elements and easily becomes anionic. When the fluorine in the fluorine containing region 241 become anionic, electrons in the part of the 2DEG layer 12a corresponding to the fluorine containing region 241 are reduced in number. Thereby, the region 12b with few electrons (hereinafter also referred to as "low electron region 12b") is formed in the part of the 2DEG layer 12a. Because the low electron region 12b is directly below the region where the gate electrode 32 is formed, the low electron region 12b together with the gate recess 221 create a synergy effect that enables a HEMT including GaN type semiconductor material to attain a normally-off characteristic. Although the fluorine containing region 241 may be formed solely in the cap layer 14, it is preferable to form the fluorine containing region 241 in both the cap layer 14 and the electron supply layer 13, and more preferably, in the cap layer 14, the electron supply layer 13, and the electron transit layer 12 for attaining the below-described effects.

(Method for Manufacturing Semiconductor Apparatus)

Next, a method for manufacturing a semiconductor apparatus according to the second embodiment of the present invention is described with reference to FIGS. 8A-10B.

Figure 8A:
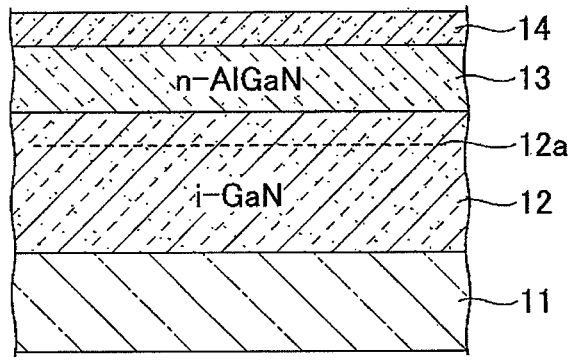
FIGS. 8A-10B are schematic diagrams for describing a method for manufacturing a semiconductor apparatus according to the second embodiment of the present invention.

As illustrated in FIG. 8A, the electron transit layer (first semiconductor layer) 12, the electron supply layer (second semiconductor layer) 13, and the cap layer (third semiconductor layer) 14 are sequentially formed on the substrate 11 formed of a semi-insulating material (e.g., SiC). In this embodiment, the electron transit layer 12 and the electron supply layer 13 are formed by epitaxial growth based on Metalorganic vapour phase epitaxy (MOVPE). It is to be noted that, in this embodiment, the electron transit layer 12 is formed with i-GaN having a thickness of approximately 3 μm. Further, the electron supply layer 13 is formed with n-AlGaN having a thickness of approximately 30 nm. The electron supply layer 13 is doped with an impurity element such as Si, so that the impurity concentration of the electron supply layer 13 is $5 \times 10^{18}$ cm$^{-3}$. Further, the cap layer 14 is formed with n-GaN having a thickness of approximately 10 nm. The cap layer 14 is doped with an impurity element such as Si, so that the impurity concentration of the cap layer 14 is $5 \times 10^{18}$ cm$^3$. Thereby, the 2DEG layer 12a is formed in the electron transit layer 12 at the vicinity of the interface between the electron transit layer 12 and the electron supply layer 13. Then, although not illustrated in the drawings, an element separation region is formed. In forming the element separation region, first, a photoresist is coated on a predetermined region(s) of the surface of the layered configuration. Then, the photoresist is developed by being exposed with an exposing device. Thereby, a resist pattern is formed having an opening at a region where the element separation region is to be formed. Then, the element separation region can be obtained by forming an insulation film or by injecting ions containing a predetermined chemical element in a dry-etched region. A gas containing a chlorine component is used for forming the dry-etched region.

Figure 8B:
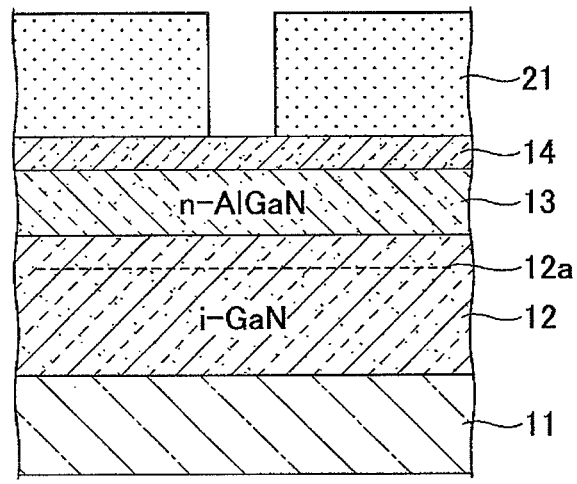

Then, as illustrated in FIG. 8B, a resist pattern 21 is formed on the surface of the cap layer 14. The resist pattern 21 is formed by coating photoresist on the surface of the cap layer 14 and developing the photoresist by exposing the photoresist with an exposing device. Thereby, the resist pattern 21 can be formed having an opening(s) formed in a region where the gate recess 221 is to be formed.

Figure 8C:
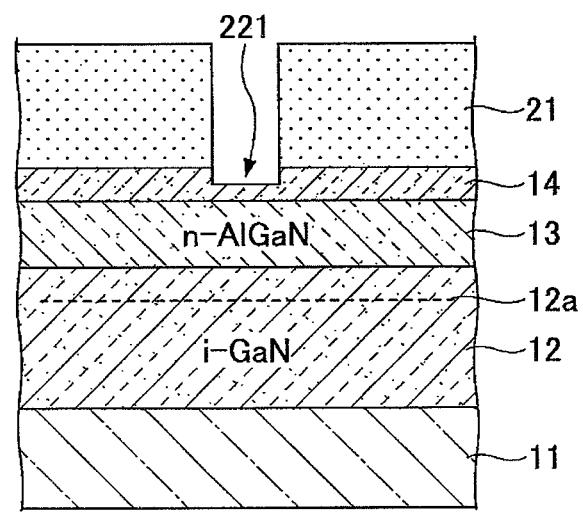

Then, as illustrated in FIG. 8C, a part of or all of the cap layer 14 having no resist pattern 21 formed thereon is removed by dry etching (e.g., RIE (Reactive Ion Etching)). Thereby, the gate recess 221 is formed. The etching gas used in the dry etching contains a mixture of a chlorine type gas (gas containing a chlorine component) and a fluorine type gas (gas containing a fluorine component) that are mixed by being guided into a dry-etching chamber of a dry-etching apparatus. Thereby, the depth of the gate recess 221 can be uniform and the bottom surface of the gate recess 221 can be flat. In this embodiment, the gate recess 221 is formed by guiding an etching gas containing $Cl_2$ of 10 sccm and $SF_6$ of 20 sccm into the etching chamber, setting the pressure inside the etching chamber to 2 Pa, and performing RIE with RF (Radio Frequency) power of 30 W.

Figure 9A:
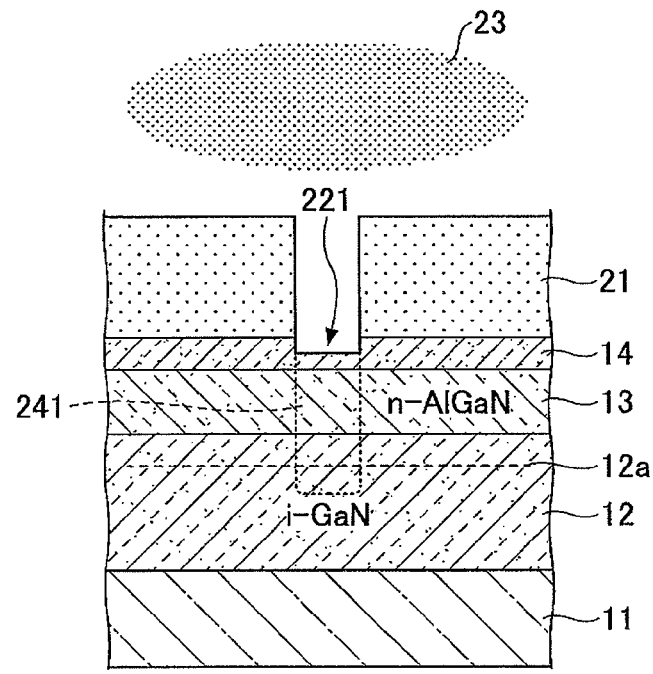

Then, as illustrated in FIG. 9A, fluorine is injected into the part of the electron transit layer 12, the part of the electron supply layer 13, and the part of the cap layer 14 that correspond to the region in which the gate recess 221 is formed by performing a plasma process using fluorine. More specifically, the plasma process is performed by guiding a gas containing a fluorine component (e.g., $C_3F_8$, $CHF_3$, $NF_3$, or $F_2$) into the etching chamber of the above-described dry-etching apparatus (used for RIE) and generating fluoride plasma 23 by applying predetermined RF power. Thereby, the fluorine containing region 241 is formed in the part of the electron transit layer 12, the part of the electron supply layer 13, and the part of the cap layer 14 that correspond to the region in which the gate recess 221 is formed. The forming of the fluorine containing region 241 causes reduction of the number of electrons in the part of the 2DEG layer 12a directly below the region in which the gate recess 221 is formed. In this embodiment, the fluorine containing region 241 is formed by guiding an etching gas containing $CF_4$ of 30 sccm into the etching chamber, setting the pressure inside the etching chamber to 1 Pa, and generating fluoride plasma 23 by applying RF (Radio Frequency) power of 100 W. In order to efficiently form the fluorine containing region 241, the RF power applied in the plasma process is preferred to be higher than the RF power applied for forming the gate recess 221.

The dry-etching process (e.g., RIE) of FIG. 8C and the plasma process of FIG. 9A are preferred to be performed in the same etching chamber. It is more preferable to consecutively perform the dry-etching process of FIG. 8C and the plasma process of FIG. 9A so that the plasma process of FIG. 9A can be performed in a state where the plasma generated in the dry-etching process still remains. The dry-etching process of FIG. 8C can be consecutively switched to the plasma process of FIG. 9A by controlling, for example, the type of gas guided into the etching chamber and the amount of gas guided into the etching chamber. By consecutively switching from the dry-etching process of FIG. 8C to the plasma process of FIG. 9A, contaminants or foreign material can be prevented from adhering to the surface of the gate recess 221 after the dry-etching process of FIG. 8C.

Figure 9B:
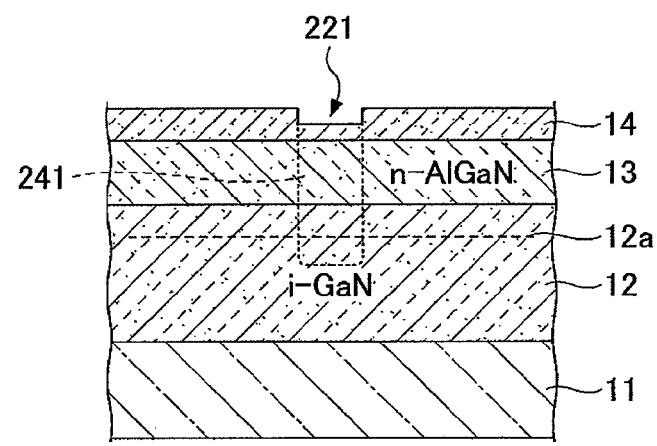

Then, as illustrated in FIG. 9B, the resist pattern 21 is removed by using, for example, an organic solvent.

Figure 9C:
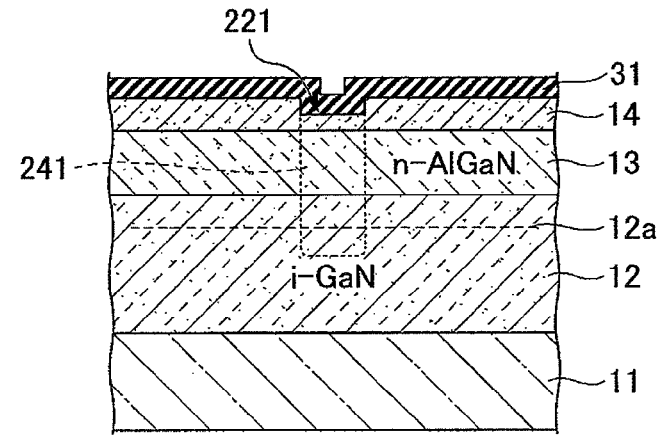

Then, as illustrated in FIG. 9C, the insulation film 31 is formed on the gate recess 221 and the cap layer 14. The insulation film 31 is to serve as a gate insulation film. In this embodiment, the insulation film 31 is formed by depositing a tantalum oxide film ($Ta_2O_5$) having a thickness of 2 nm-200 nm. More specifically, the insulation film 31 is formed by depositing a tantalum oxide film having a thickness of approximately 50 nm.

Figure 10A:
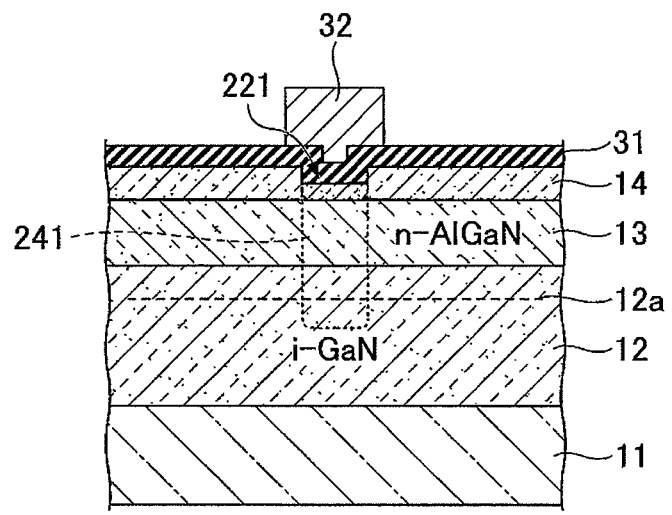

Then, as illustrated in FIG. 10A, the gate electrode 32 is formed on the region where the gate recess 221 is formed via the insulation film 31. More specifically, although not illustrated in the drawings, a resist pattern having an opening at a region where the gate electrode 32 is to be formed is formed by applying photoresist on the insulation film 31 and developing the photoresist by exposing the photoresist with an exposing device. Then, a metal film is formed by sequentially depositing a Ni film having a thickness of approximately 30 nm and an Au film having a thickness of approximately 400 nm. The Ni film and the Au film are deposited by vacuum deposition. Then, the metal film on the resist pattern is removed together with the resist pattern by performing lift-off using an organic solvent or the like. Thereby, the metal film deposited on a region having no resist pattern formed thereon remains on the insulation film 31 and the gate recess 221. Accordingly, the remaining metal film becomes the gate electrode 32.

Figure 10B:
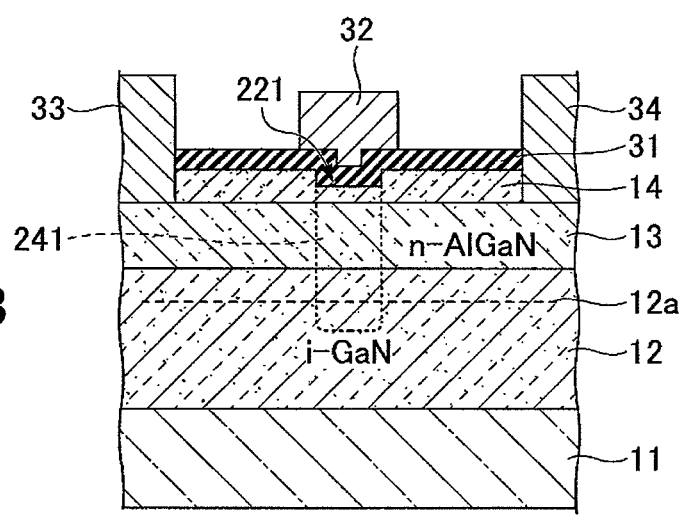

Then, as illustrated in FIG. 10B, the source electrode 33 and the drain electrode 34 are formed. More specifically, a resist pattern (not illustrated) having openings at regions where the source and drain electrodes 33, 34 are to be formed is formed by applying photoresist on the surface of the insulation film 31 and developing the photoresist by exposing the photoresist with an exposing device. Then, the insulation film 31 and the cap layer 14 are removed from regions having no resist pattern formed thereon by performing dry-etching (e.g., RIE) using a gas containing a chlorine component. Thereby, opening regions are formed on the insulation film 31. Then, the resist pattern is removed. Then, a resist pattern (not illustrated) having openings at regions where the source and drain electrodes 33, 34 are to be formed is formed by applying photoresist on, for example, the surface of the insulation film 31 and developing the photoresist by exposing the photoresist with an exposing device. Then, a metal film is formed by sequentially depositing a Ta film having a thickness of approximately 20 nm and an Al film having a thickness of approximately 200 nm. The Ta film and the Al film are deposited by vacuum deposition. Then, the metal film on the resist pattern is removed together with the resist pattern by performing lift-off using an organic solvent or the like. Thereby, the metal film deposited on regions having no resist pattern formed thereon remains on the electron supply layer 13. Accordingly, the remaining metal film becomes the source electrode 33 and the drain electrode 34. Then, a thermal process is performed on the source electrode 33 and the drain electrode 34 at a temperature of 400° C. to 1000° C. (e.g., 550° C.). Thereby, ohmic contact is established between the source electrode 33 and the drain electrode 34. It is to be noted that, although resist patterns are formed twice in the above-described embodiment, the resist pattern for forming the opening regions of the insulation film 31 can also be used as the resist pattern for forming the source electrode 33 and the drain electrode 34. In this case, the resist pattern need only be formed once.

Hence, with the above-described embodiment of the method for manufacturing a semiconductor apparatus, the semiconductor apparatus 200 can be obtained. The semiconductor apparatus 200 manufactured by the above-described embodiment of the method for manufacturing a semiconductor apparatus consistently attains a normally-off characteristic by having the fluorine containing region 24 formed in a part of, for example, the electron supply layer (n-AlGaN layer, second semiconductor layer) corresponding to the region where the gate recess 221 is formed. Further, the etching rate can be lowered by adding a gas containing a fluorine component to the gas used for etching. Thereby, etching can be uniformly performed on the etching target. That is, the gate recess 221 can be formed having a uniform depth and a flat bottom surface. Accordingly, the yield of the semiconductor apparatus 200 can be improved and attain a steady operating characteristic. Details of the second embodiment are substantially the same as those of the first embodiment except for the above-described details of the second embodiment.

Third Embodiment

Semiconductor Apparatus

Figure 11:
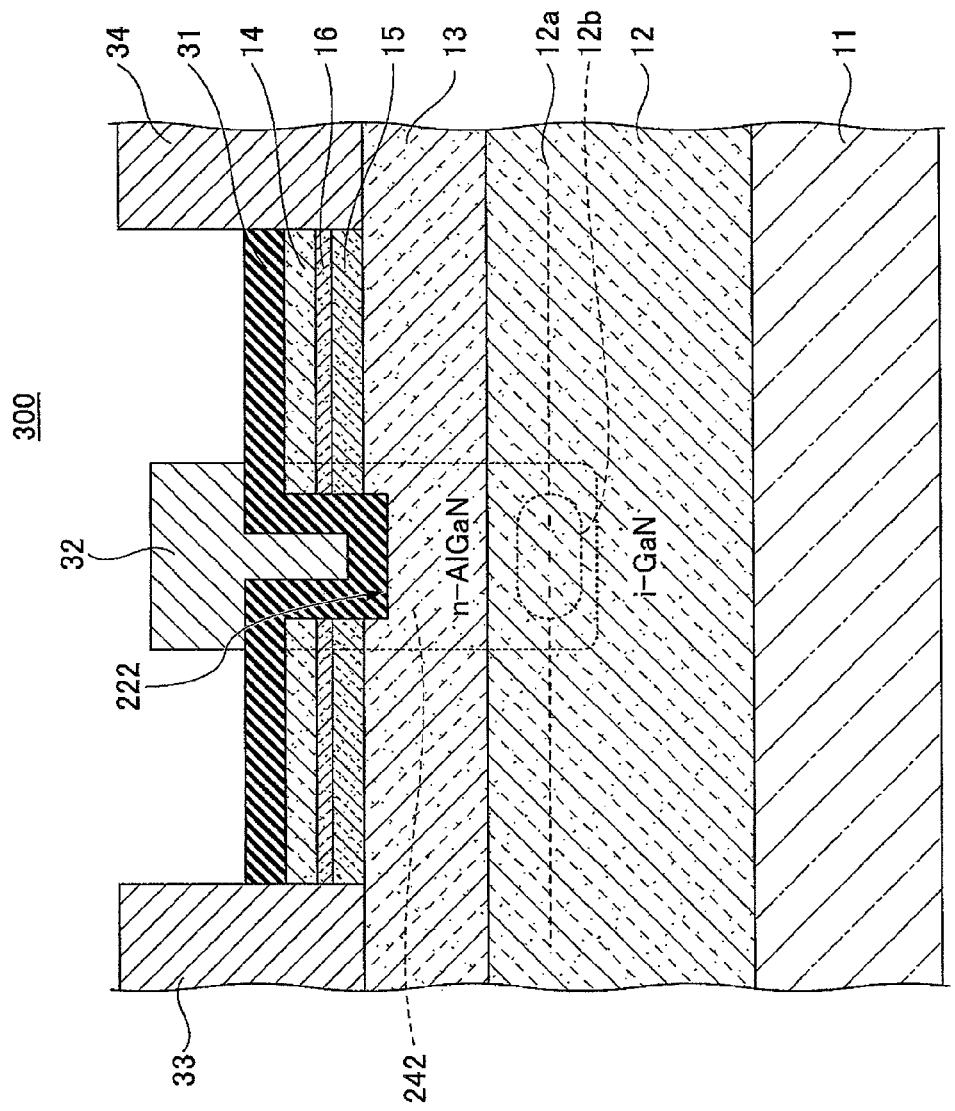
FIG. 11 is a schematic diagram illustrating a semiconductor apparatus according to a third embodiment of the present invention.

A semiconductor apparatus 300 according to the third embodiment of the present invention is described with reference to FIG. 11. In the third embodiment, like components are described with like reference numerals as those of the first and the second embodiments and are not further described. FIG. 11 is a schematic diagram illustrating the semiconductor apparatus 300 according to the third embodiment of the present invention. The semiconductor apparatus 300 has semiconductor layers including the electron transmit layer 12, the electron supply layer 13, a protection layer 15, a cap layer 16, and the cap layer 14 sequentially formed on the substrate 11. The substrate 11 is formed of, for example, GaN. The protection layer 15 is formed of n-GaN. The cap layer 16 is formed of i-AlN. The electron transmit layer (which is to be a first semiconductor layer) 12 is formed of i-GaN. The electron supply layer (which is to be a second semiconductor layer) 13 is formed of n-AlGaN. The cap layer (which is to be a third semiconductor layer) 14 is formed of n-GaN. Accordingly, the two-dimensional electron gas (2DEG) layer 12a is formed in the electron transmit layer 12 at the vicinity of the interface between the electron transmit layer 12 and the electron supply layer 13. The gate recess 222 is formed by removing a part of or all of the cap layer 14, the cap layer 16, the protection layer 15, and the electron supply layer 13. A region 242 containing fluorine (F) (hereinafter also referred to as "fluorine containing region 242") is formed in, for example, a part of the electron transmit layer 12, a part of the electron supply layer 13, a part of the protection layer 15, a part of the cap layer 16, and a part of the cap layer 14 that correspond to the region in which the gate recess 222 is formed. Further, the insulation film (which is to be the gate insulation film) 31 is formed on the gate recess 222 and the cap layer 14. The gate electrode 32 is formed on the region where the gate recess 222 is formed via the insulation film 31. Further, the source electrode 33 and the drain electrode 34 are formed on predetermined regions of the electron supply layer 13. Alternatively, the source electrode 33 and the drain electrode 34 may be formed on predetermined regions of the electron transit layer 12.

With the semiconductor apparatus 300 according to the third embodiment, the fluorine containing region 242 is formed at the part of the cap layer 14, the part of the cap layer 16, the part of the protection layer 15, the part of the electron supply layer 13, and the part of the electron transit layer 12 that correspond to the region in which the gate recess 221 is formed. That is, in this embodiment, the fluorine containing region 242 is formed in, for example, the region in which the gate recess 221 is formed and a part of the cap layer 14 along the sidewalls of the gate recess 222, a part of the cap layer 16 along the sidewalls of the gate recess 222, a part of the protection layer 15 along the sidewalls of the gate recess 222, a part of the electron supply layer 13 along the sidewalls of the gate recess 222, and a part of the electron transit layer 12 along the sidewalls of the gate recess 222. Fluorine (F) has the highest electronegativity among chemical elements and easily becomes anionic. When the fluorine in the fluorine containing region 242 become anionic, electrons in the part of the 2DEG layer 12a corresponding to the fluorine containing region 242 are reduced in number. Thereby, the region 12b with few electrons (hereinafter also referred to as "low electron region 12b") is formed in the part of the 2DEG layer 12a. Because the low electron region 12b is directly below the region where the gate electrode 32 is formed, the low electron region 12b together with the gate recess 222 create a synergy effect that enables a HEMT including GaN type semiconductor material to attain a normally-off characteristic. Further, by forming the fluorine containing region 242 along the sidewalls of the gate recess 222, the gate leakage current (where the sidewalls of the gate recess are leakage paths) can be reduced. Because gate leakage current from the sidewalls of the gate recess 222 tends to increase due to positive piezo charges generated at a lower surface of the AlN layer (cap layer) 16 of three layer configuration formed of GaN, AlN, GaN, it is preferable to form the fluorine containing region 242 along the sidewalls of the gate recess 222.

Although the fluorine containing region 242 may be formed solely in the electrode supply layer 13, it is preferable to form the fluorine containing region 242 in both the electron supply layer 13 and the electron transit layer 12, and more preferably, in the cap layer 14, the cap layer 16, the protection layer 15, the electron supply layer 13, and the electron transit layer 12 for attaining the below-described effects.

(Method for Manufacturing Semiconductor Apparatus)

Next, a method for manufacturing a semiconductor apparatus according to the third embodiment of the present invention is described with reference to FIGS. 12A-14B.

Figure 12A:
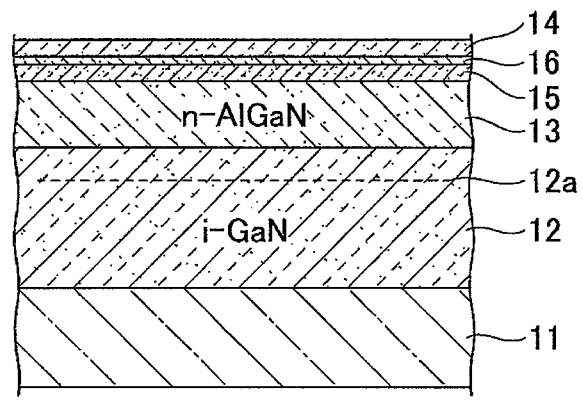
FIGS. 12A-14B are schematic diagrams for describing a method for manufacturing a semiconductor apparatus according to the third embodiment of the present invention.

As illustrated in FIG. 12A, the electron transit layer (first semiconductor layer) 12, the electron supply layer (second semiconductor layer) 13, the protection layer 15, the cap layer 16, and the cap layer (third semiconductor layer) 14 are formed on the substrate 11 formed of, for example, GaN. It is to be noted that the electron transit layer 12, the electron supply layer 13, the protection layer 15, the cap layer 16, and the cap layer 14 are sequentially formed by epitaxial growth based on MOVPE. It is to be noted that, in this embodiment, the electron transit layer 12 is formed with i-GaN having a thickness of approximately 3 μm. Further, the electron supply layer 13 is formed with n-AlGaN having a thickness of approximately 30 nm. The electron supply layer 13 is doped with an impurity element such as Si, so that the impurity concentration of the electron supply layer 13 is $5 \times 10^{18}$ cm$^{-3}$. Further, the protection layer 15 is formed with n-GaN having a thickness of approximately 10 nm. The protection layer 15 is doped with an impurity element such as Si, so that the impurity concentration of the protection layer 15 is $5 \times 10^{18}$ cm$^{-3}$. Further, the cap layer 16 is formed with i-AlN having a thickness of approximately 2 μm. Further, the cap layer 14 is formed with n-GaN having a thickness of approximately 10 nm. The cap layer 14 is doped with an impurity element such as Si, so that the impurity concentration of the cap layer 14 is $5\times10^{18}$ cm$^{-3}$. Thereby, the 2DEG layer 12a is formed in the electron transit layer 12 at the vicinity of the interface between the electron transit layer 12 and the electron supply layer 13. Then, although not illustrated in the drawings, an element separation region is formed. In forming the element separation region, first, a photoresist is coated on a predetermined region(s) of the surface of the layered configuration. Then, the photoresist is developed by being exposed with an exposing device. Thereby, a resist pattern is formed having an opening at a region where the element separation region is to be formed. Then, the element separation region can be obtained by forming an insulation film or by injecting ions containing a predetermined chemical element in a dry-etched region. A gas containing a chlorine component is used for forming the dry-etched region.

Figure 12B:
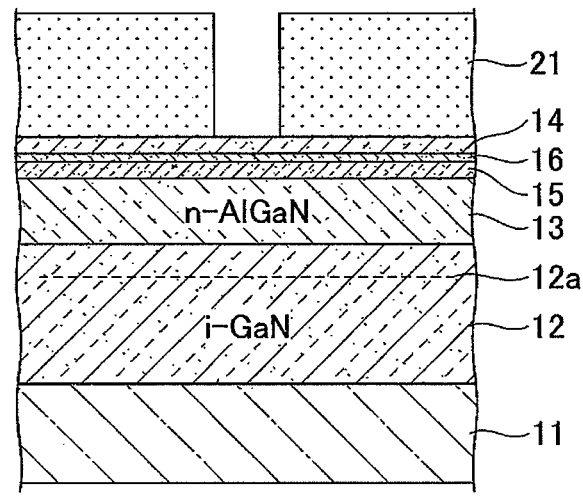

Then, as illustrated in FIG. 12B, a resist pattern 21 is formed on the surface of the cap layer 14. The resist pattern 21 is formed by coating photoresist on the surface of the cap layer 14 and developing the photoresist by exposing the photoresist with an exposing device. Thereby, the resist pattern 21 can be formed having an opening(s) formed in a region where the gate recess 222 is to be formed.

Figure 12C:
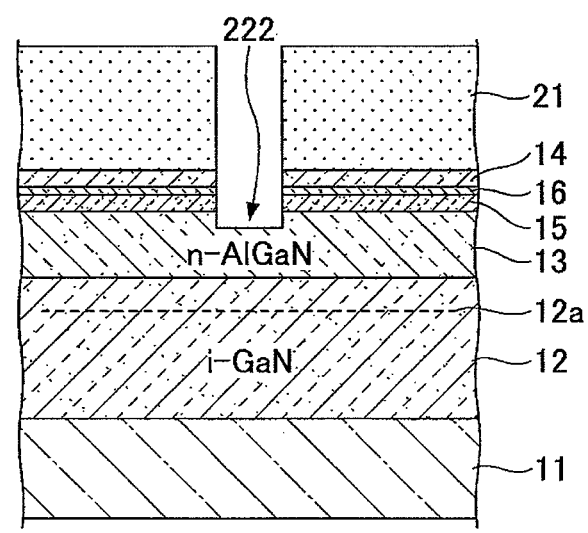

Then, as illustrated in FIG. 12C, a part of or all of the cap layer 14, the cap layer 16, the protection layer 15, and the electron supply layer 13 having no resist pattern 21 formed thereon is removed by dry etching (e.g., RIE (Reactive Ion Etching)). Thereby, the gate recess 222 is formed. The etching gas used in the dry etching contains a mixture of a chlorine type gas (gas containing a chlorine component) and a fluorine type gas (gas containing a fluorine component) that are mixed by being guided into a dry-etching chamber of a dry-etching apparatus. Thereby, the depth of the gate recess 222 can be uniform and the bottom surface of the gate recess 222 can be flat. In this embodiment, the gate recess 222 is formed by guiding an etching gas containing $Cl_2$ of 15 sccm and $SF_6$ of 15 sccm into the etching chamber, setting the pressure inside the etching chamber to 2 Pa, and performing RIE with RF (Radio Frequency) power of 30 W.

Figure 13A:
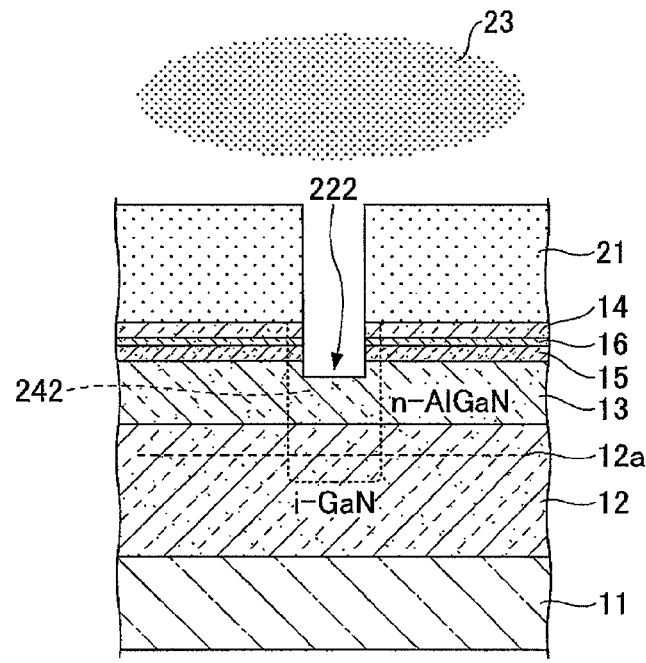

Then, as illustrated in FIG. 13A, fluorine is injected into the part of the electron transit layer 12, the part of the electron supply layer 13, the part of the protection layer 15, the part of the cap layer 16, and the part of the cap layer 14 that correspond to the region in which the gate recess 222 is formed by performing a plasma process using fluorine. More specifically, the plasma process is performed by guiding a gas containing a fluorine component (e.g., $SF_6$, $CF_4$, $C_2F_6$, $C_3F_8$, $CHF_3$, $NF_3$, or $F_2$) into the etching chamber of the above-described dry-etching apparatus (used for RIE) and generating fluoride plasma 23 by applying a predetermined RF power. Thereby, the fluorine containing region 242 is formed in the region in which the gate recess 222 is formed, the part of the cap layer 14 along the sidewalls of the gate recess 222, the part of the cap layer 16 along the sidewalls of the gate recess 222, the part of the protection layer 15 along the sidewalls of the gate recess 222, the part of the electron supply layer 13 along the sidewalls of the gate recess 222, and the part of the electron transit layer 12 along the sidewalls of the gate recess 222. The forming of the fluorine containing region 242 causes reduction of the number of electrons in the part of the 2DEG layer 12a directly below the region in which the gate recess 222 is formed. In this embodiment, the fluorine containing region 242 is formed by guiding an etching gas containing $CF_4$ of 30 sccm into the etching chamber, setting the pressure inside the etching chamber to 10 Pa, and generating fluoride plasma 23 by applying RF (Radio Frequency) power of 200 W. In order to efficiently form the fluorine containing region 242, the RF power applied in the plasma process is preferred to be higher than the RF power applied for forming the gate recess 222.

The dry-etching process (e.g., RIE) of FIG. 12C and the plasma process of FIG. 13A are preferred to be performed in the same etching chamber. It is more preferable to consecutively perform the dry-etching process of FIG. 12C and the plasma process of FIG. 13A so that the plasma process of FIG. 13A can be performed in a state where the plasma generated in the dry-etching process still remains. The dry-etching process of FIG. 12C can be consecutively switched to the plasma process of FIG. 13A by controlling, for example, the type of gas guided into the etching chamber and the amount of gas guided into the etching chamber. By consecutively switching from the dry-etching process of FIG. 12C to the plasma process of FIG. 13A, contaminants or foreign material can be prevented from adhering to the surface of the gate recess 221 after the dry-etching process of FIG. 12C.

Figure 13B:
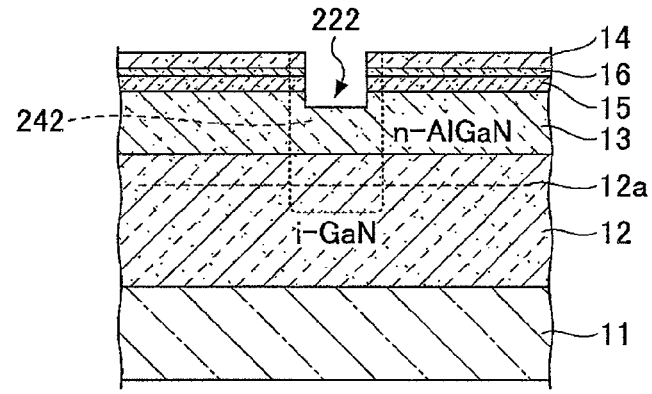

Then, as illustrated in FIG. 13B, the resist pattern 21 is removed by using, for example, an organic solvent.

Figure 13C:
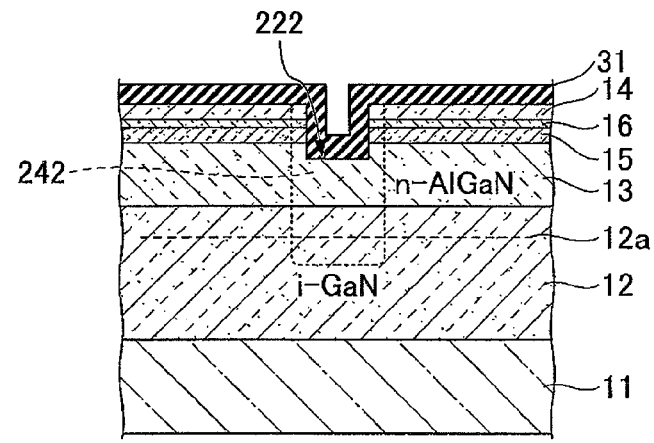

Then, as illustrated in FIG. 13C, the insulation film 31 is formed on the gate recess 222 and the cap layer 14. The insulation film 31 is to serve as a gate insulation film. In this embodiment, the insulation film 31 is formed by depositing a silicon nitride film ($Si_2N_4$) having a thickness of 2 nm-200 nm. More specifically, the insulation film 31 is formed by depositing a silicon nitride film having a thickness of approximately 20 nm.

Figure 14A:
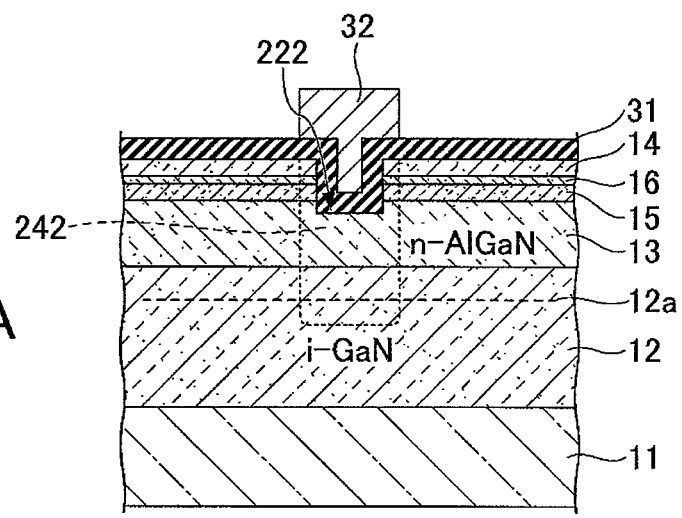

Then, as illustrated in FIG. 14A, the gate electrode 32 is formed on the region where the gate recess 222 is formed via the insulation film 31. More specifically, although not illustrated in the drawings, a resist pattern having an opening at a region where the gate electrode 32 is to be formed is formed by applying photoresist on the insulation film 31 and developing the photoresist by exposing the photoresist with an exposing device. Then, a metal film is formed by sequentially depositing a Ni film having a thickness of approximately 30 nm and an Au film having a thickness of approximately 400 nm. The Ni film and the Au film are deposited by vacuum deposition. Then, the metal film on the resist pattern is removed together with the resist pattern by performing lift-off using an organic solvent or the like. Thereby, the metal film deposited on a region having no resist pattern formed thereon remains on the insulation film 31 and the gate recess 222. Accordingly, the remaining metal film becomes the gate electrode 32.

Figure 14B:
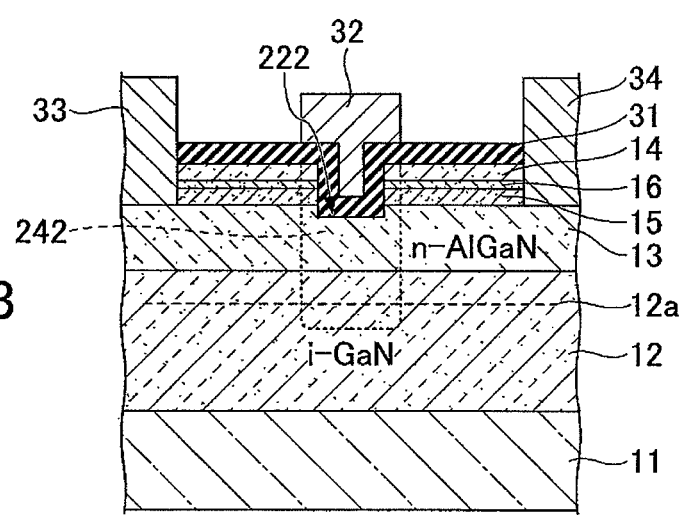

Then, as illustrated in FIG. 14B, the source electrode 33 and the drain electrode 34 are formed. More specifically, a resist pattern (not illustrated) having openings at regions where the source and drain electrodes 33, 34 are to be formed are formed by applying photoresist on the surface of the insulation film 31 and developing the photoresist by exposing the photoresist with an exposing device. Then, the insulation film 31, the protection layer 15, the cap layer 16, and the cap layer 14 are removed from regions having no resist pattern formed thereon by performing dry etching (e.g., RIE) using a gas containing a chlorine component. Thereby, opening regions are formed on the insulation film 31. Then, the resist pattern is removed. Then, a resist pattern (not illustrated) having openings at regions where the source and drain electrodes 33, 34 are to be formed is formed by applying photoresist on, for example, the surface of the insulation film 31 and developing the photoresist by exposing the photoresist with an exposing device. Then, a metal film is formed by sequentially depositing a Ta film having a thickness of approximately 20 nm and an Al film having a thickness of approximately 200 nm. The Ta film and the Al film are deposited by vacuum deposition. Then, the metal film on the resist pattern is removed together with the resist pattern by performing lift-off using an organic solvent or the like. Thereby, the metal film deposited on regions having no resist pattern formed thereon remains on the electron supply layer 13. Accordingly, the remaining metal film becomes the source electrode 33 and the drain electrode 34. Then, a thermal process is performed on the source electrode 33 and the drain electrode 34 at a temperature of 400° C. to 1000° C. (e.g., 550° C.). Thereby, ohmic contact is established between the source electrode 33 and the drain electrode 34. It is to be noted that, although resist patterns are formed twice in the above-described embodiment, the resist pattern for forming the opening regions of the insulation film 31 can also be used as the resist pattern for forming the source electrode 33 and the drain electrode 34. In this case, the resist pattern need only be formed once.

Hence, with the above-described embodiment of the method for manufacturing a semiconductor apparatus, the semiconductor apparatus 300 can be obtained. The semiconductor apparatus 300 manufactured by the above-described embodiment of the method for manufacturing a semiconductor apparatus consistently attains a normally-off characteristic by having the fluorine containing region 24 formed in a part of, for example, the electron supply layer (n-AlGaN layer, second semiconductor layer) 13 corresponding to the region where the gate recess 222 is formed. Further, the etching rate can be lowered by adding a gas containing a fluorine component to the gas used for etching. Thereby, etching can be uniformly performed on the etching target. That is, the gate recess 222 can be formed having a uniform depth and a flat bottom surface. Accordingly, the yield of the semiconductor apparatus 300 can be improved and attain a steady operating characteristic. Details of the third embodiment are substantially the same as those of the first embodiment except for the above-described details of the third embodiment.

Fourth Embodiment

Semiconductor Apparatus

A semiconductor apparatus 400 according to the fourth embodiment of the present invention is described with reference to FIG. 15. In the fourth embodiment, like components are described with like reference numerals as those of the first, the second, and the third embodiments and are not further described. FIG. 15 is a schematic diagram illustrating the semiconductor apparatus 400 according to the fourth embodiment of the present invention. The semiconductor apparatus 400 has semiconductor layers including the electron transmit layer 12, the electron supply layer 13, and the cap layer 14 sequentially formed on the substrate 11. The substrate 11 is formed of, for example, sapphire ($Al_2O_3$). The electron transmit layer (which is to be a first semiconductor layer) 12 is formed of i-GaN. The electron supply layer (which is to be a second semiconductor layer) 13 is formed of n-AlGaN. The cap layer (which is to be a third semiconductor layer) 14 is formed of N—GaN. Accordingly, the two-dimensional electron gas (2DEG) layer 12a is formed in the electron transmit layer 12 at the vicinity of the interface between the electron transmit layer 12 and the electron supply layer 13. The gate recess 223 is formed by removing a part of or all of the cap layer 14 and the electron supply layer 13. A region 243 containing fluorine (F) (hereinafter also referred to as "fluorine containing region 243") is formed in, for example, a part of the electron transit layer 12, a part of the electron supply layer 13, and a part of the cap layer 14 that correspond to the region in which the gate recess 223 is formed. Further, the insulation film (which is to be the gate insulation film) 31 is formed on the gate recess 223 and the cap layer 14. The gate electrode 32 is formed on the region where the gate recess 223 is formed via the insulation film 31. Further, the source electrode 33 and the drain electrode 34 are formed on predetermined regions of the electron supply layer 13. Alternatively, the source electrode 33 and the drain electrode 34 may be formed on predetermined regions of the electron transit layer 12.

With the semiconductor apparatus 400 according to the fourth embodiment, the fluorine containing region 243 is formed at the part of the cap layer 14, the part of the electron supply layer 13, and the part of the electron transit layer 12 that correspond to the region in which the gate recess 223 is formed. Fluorine (F) has the highest electronegativity among chemical elements and easily becomes anionic. When the fluorine in the fluorine containing region 243 become anionic, electrons in the part of the 2DEG layer 12a corresponding to the fluorine containing region 243 are reduced in number. Thereby, the region 12b with few electrons (hereinafter also referred to as "low electron region 12b") is formed in the part of the 2DEG layer 12a. Because the low electron region 12b is directly below the region where the gate electrode 32 is formed, the low electron region 12b together with the gate recess 223 create a synergy effect that enables a HEMT including GaN type semiconductor material to attain a normally-off characteristic. Although the fluorine containing region 243 may be formed solely in the cap layer, it is preferable to form the fluorine containing region 243 in both the electron supply layer 13 and the electron transit layer 12 for attaining the below-described effects.

(Method for Manufacturing Semiconductor Apparatus)

Next, a method for manufacturing a semiconductor apparatus according to the fourth embodiment of the present invention is described with reference to FIGS. 16A-18B.

Figure 16A:
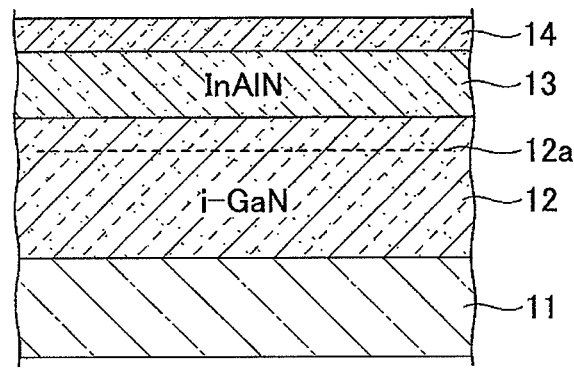
FIGS. 16A-18B are schematic diagrams for describing a method for manufacturing a semiconductor apparatus according to the fourth embodiment of the present invention.

As illustrated in FIG. 16A, the electron transit layer (first semiconductor layer) 12, the electron supply layer (second semiconductor layer) 13, and the cap layer (third semiconductor layer) 14 are sequentially formed on the substrate 11 formed of sapphire ($Al_2O_3$). In this embodiment, the electron transit layer 12, the electron supply layer 13, and the cap layer 14 are formed by epitaxial growth based on Metalorganic vapour phase epitaxy (MOVPE). It is to be noted that, in this embodiment, the electron transit layer 12 is formed with i-GaN having a thickness of approximately 3 µm. Further, the electron supply layer 13 is formed with i-InAlN having a thickness of approximately 30 nm. Although the electron supply layer 13 is not doped with an impurity element, n-InAlN is doped with an impurity element such as Si, so that the impurity concentration of the electron supply layer 13 becomes $5 \times 10^{18}$ $cm^{-3}$. Further, the cap layer 14 is formed with n-GaN having a thickness of approximately 10 nm. The cap layer 14 is doped with an impurity element such as Si, so that the impurity concentration of the cap layer 14 is $5 \times 10^{18}$ $cm^{-3}$. Thereby, the 2DEG layer 12a is formed in the electron transit layer 12 at the vicinity of the interface between the electron transit layer 12 and the electron supply layer 13. Then, although not illustrated in the drawings, an element separation region is formed. In forming the element separation region, first, photoresist is coated on a predetermined region(s) of the surface of the layered configuration. Then, the photoresist is developed by being exposed with an exposing device. Thereby, a resist pattern is formed having an opening at a region where the element separation region is to be formed. Then, the element separation region can be obtained by forming an insulation film or by injecting ions containing a predetermined chemical element in a dry-etched region. A gas containing a chlorine component is used for forming the dry-etched region.

Figure 16B:
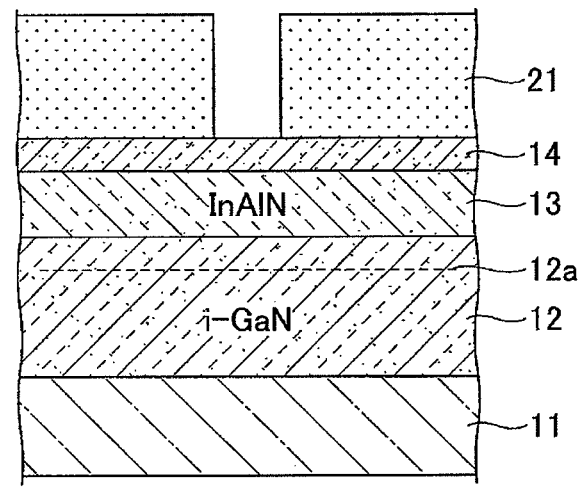

Then, as illustrated in FIG. 16B, a resist pattern 21 is formed on the surface of the cap layer 14. The resist pattern 21 is formed by coating photoresist on the surface of the cap layer 14 and developing the photoresist by exposing the photoresist with an exposing device. Thereby, the resist pattern 21 can be formed having an opening(s) formed in a region where the gate recess 221 is to be formed.

Figure 16C:
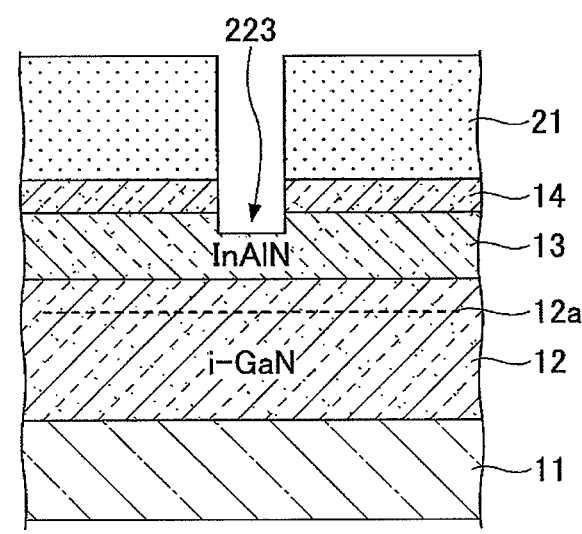

Then, as illustrated in FIG. 16C, all of the cap layer 14 and a part of or all of the electron supply layer 13 having no resist pattern 21 formed thereon are removed by dry etching (e.g., RIE (Reactive Ion Etching)). Thereby, the gate recess 223 is formed. The etching gas used in the dry etching contains a mixture of a chlorine type gas (gas containing a chlorine component) and a fluorine type gas (gas containing a fluorine component) that are mixed by being guided into a dry-etching chamber of a dry-etching apparatus. Thereby, the depth of the gate recess 223 can be uniform and the bottom surface of the gate recess 223 can be flat. In this embodiment, the gate recess 223 is formed by guiding an etching gas containing $Cl_2$ of 20 sccm and $SF_6$ of 5 sccm into the etching chamber, setting the pressure inside the etching chamber to 10 Pa, and performing RIE with RF (Radio Frequency) power of 10 W.

Figure 17A:
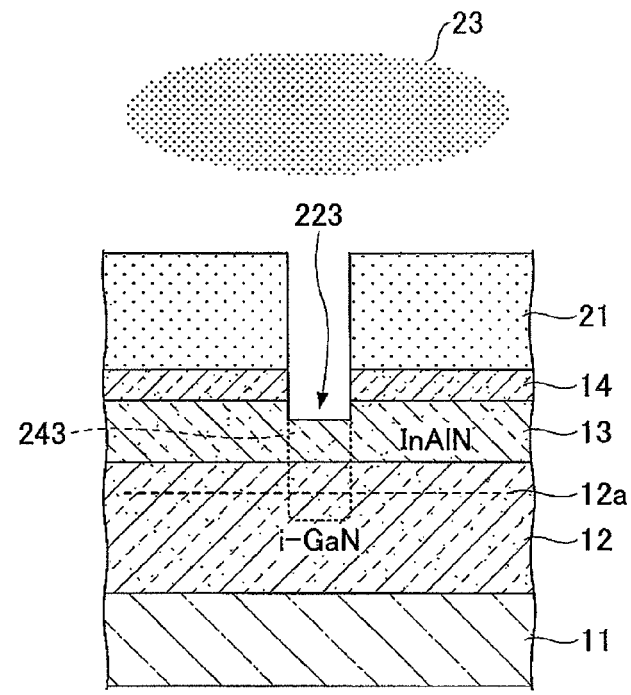

Then, as illustrated in FIG. 17A, fluorine is injected into the part of the electron transit layer 12, the part of the electron supply layer 13, and the part of the cap layer 14 that correspond to the region in which the gate recess 223 is formed by performing a plasma process using fluorine. More specifically, the plasma process is performed by guiding a gas containing a fluorine component (e.g., $SF_6$, $CF_4$, $C_2F_6$, $C_3F_8$, $CHF_3$, $NF_3$, or $F_2$) into the etching chamber of the above-described dry-etching apparatus (used for RIE) and generating fluoride plasma 23 by applying a predetermined RF power. Thereby, the fluorine containing region 243 is formed in the part of the electron transit layer 12, the part of the electron supply layer 13, and the part of the cap layer 14 that correspond to the region in which the gate recess 223 is formed. The forming of the fluorine containing region 243 causes reduction of the number of electrons in the part of the 2DEG layer 12a directly below the region in which the gate recess 223 is formed. In this embodiment, the fluorine containing region 243 is formed by guiding an etching gas containing $CF_4$ of 30 sccm into the etching chamber, setting the pressure inside the etching chamber to 1 Pa, and generating fluoride plasma 23 by applying RF (Radio Frequency) power of 500 W. In order to efficiently form the fluorine containing region 243, the RF power applied in the plasma process is preferred to be higher than the RF power applied for forming the gate recess 223.

The dry-etching process (e.g., RIE) of FIG. 16C and the plasma process of FIG. 17A are preferred to be performed in the same etching chamber. It is more preferable to consecutively perform the dry-etching process of FIG. 16C and the plasma process of FIG. 17A so that the plasma process of FIG. 17A can be performed in a state where the plasma generated in the dry-etching process still remains. The dry-etching process of FIG. 16C can be consecutively switched to the plasma process of FIG. 17A by controlling, for example, the type of gas guided into the etching chamber and the amount of gas guided into the etching chamber. By consecutively switching from the dry-etching process of FIG. 16C to the plasma process of FIG. 17A, contaminants or foreign material can be prevented from adhering to the surface of the gate recess 223 after the dry-etching process of FIG. 16C.

Figure 17B:
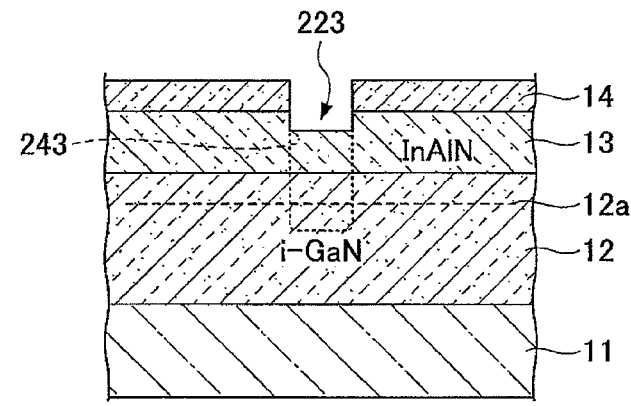

Then, as illustrated in FIG. 17B, the resist pattern 21 is removed by using, for example, an organic solvent.

Figure 17C:
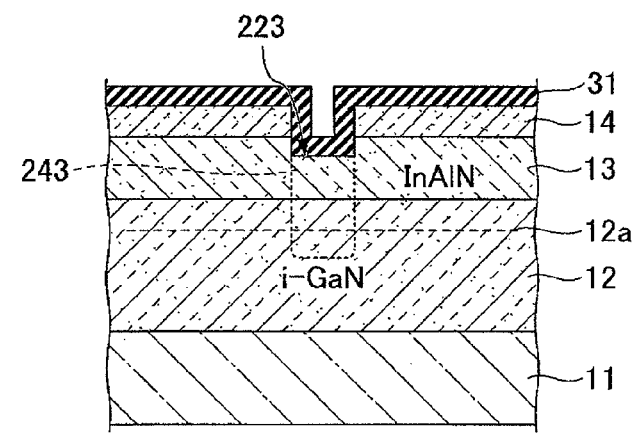

Then, as illustrated in FIG. 17C, the insulation film 31 is formed on the gate recess 223 and the cap layer 14. The insulation film 31 is to serve as a gate insulation film. In this embodiment, the insulation film 31 is formed by depositing a hafnium aluminum oxide film (HfAlO) having a thickness of 2 nm-200 nm. More specifically, the insulation film 31 is formed by depositing a hafnium aluminum oxide film having a thickness of approximately 10 nm.

Figure 18A:
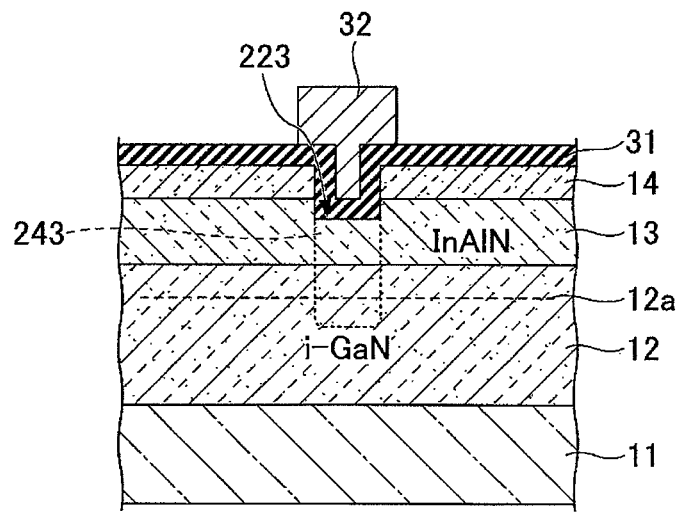

Then, as illustrated in FIG. 18A, the gate electrode 32 is formed on the region where the gate recess 223 is formed via the insulation film 31. More specifically, although not illustrated in the drawings, a resist pattern having an opening at a region where the gate electrode 32 is to be formed is formed by applying photoresist on the insulation film 31 and developing the photoresist by exposing the photoresist with an exposing device. Then, a metal film is formed by sequentially depositing a Ni film having a thickness of approximately 30 nm and an Au film having a thickness of approximately 400 nm. The Ni film and the Au film are deposited by vacuum deposition. Then, the metal film on the resist pattern is removed together with the resist pattern by performing lift-off using an organic solvent or the like. Thereby, the metal film deposited on a region having no resist pattern formed thereon remains on the insulation film 31 and the gate recess 221. Accordingly, the remaining metal film becomes the gate electrode 32.

Figure 18B:
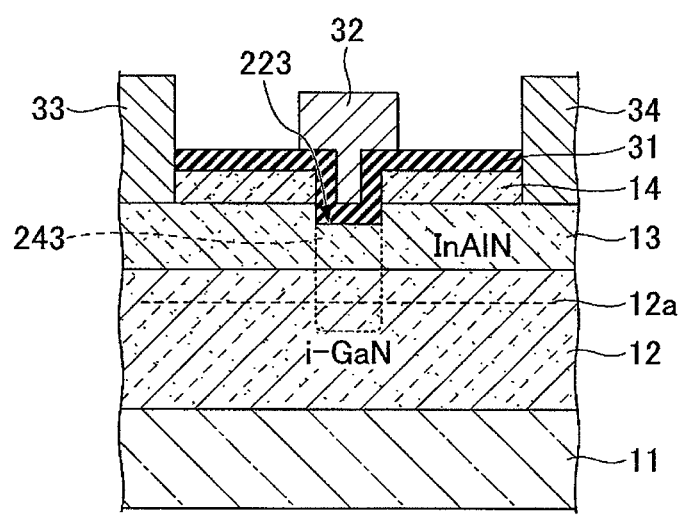

Then, as illustrated in FIG. 18B, the source electrode 33 and the drain electrode 34 are formed. More specifically, a resist pattern (not illustrated) having openings at regions where the source and drain electrodes 33, 34 are to be formed are formed by applying photoresist on the surface of the insulation film 31 and developing the photoresist by exposing the photoresist with an exposing device. Then, the insulation film 31 and the cap layer 14 are removed from regions having no resist pattern formed thereon by performing dry etching (e.g., RIE) using a gas containing a chlorine component. Thereby, opening regions are formed on the insulation film 31. Then, the resist pattern is removed. Then, a resist pattern (not illustrated) having openings at regions where the source and drain electrodes 33, 34 are to be formed are formed by applying photoresist on, for example, the surface of the insulation film 31 and developing the photoresist by exposing the photoresist with an exposing device. Then, a metal film is formed by sequentially depositing a Ta film having a thickness of approximately 20 nm and an Al film having a thickness of approximately 200 nm. The Ta film and the Al film are deposited by vacuum deposition. Then, the metal film on the resist pattern is removed together with the resist pattern by performing lift-off using an organic solvent or the like. Thereby, the metal film deposited on regions having no resist pattern formed thereon remains on the electron supply layer 13. Accordingly, the remaining metal film becomes the source electrode 33 and the drain electrode 34. Then, a thermal process is performed on the source electrode 33 and the drain electrode 34 at a temperature of 400° C. to 1000° C. (e.g., 550° C.). Thereby, ohmic contact is established between the source electrode 33 and the drain electrode 34. It is to be noted that, although resist patterns are formed twice in the above-described embodiment, the resist pattern for forming the opening regions of the insulation film 31 can also be used as the resist pattern for forming the source electrode 33 and the drain electrode 34. In this case, the resist pattern need only be formed once.

Hence, with the above-described embodiment of the method for manufacturing a semiconductor apparatus, the semiconductor apparatus 400 can be obtained. The semiconductor apparatus 400 manufactured by the above-described embodiment of the method for manufacturing a semiconductor apparatus consistently attains a normally-off characteristic by having the fluorine containing region 24 formed in a part of, for example, the electron supply layer corresponding to the region where the gate recess 223 is formed. Further, the etching rate can be lowered by adding a gas containing a fluorine component to the gas used for etching. Thereby, etching can be uniformly performed on the etching target. That is, the gate recess 223 can be formed having a uniform depth and a flat bottom surface. Accordingly, the yield of the semiconductor apparatus 400 can be improved and attain a steady operating characteristic. Details of the fourth embodiment are substantially the same as those of the first embodiment except for the above-described details of the fourth embodiment.

Fifth Embodiment

Next, a method for manufacturing a semiconductor apparatus according to the fifth embodiment of the present invention is described with reference to FIGS. 19A-21B. The method for manufacturing a semiconductor apparatus according to the fifth embodiment is another method for manufacturing the semiconductor apparatus 100 of the first embodiment.

Figure 19A:
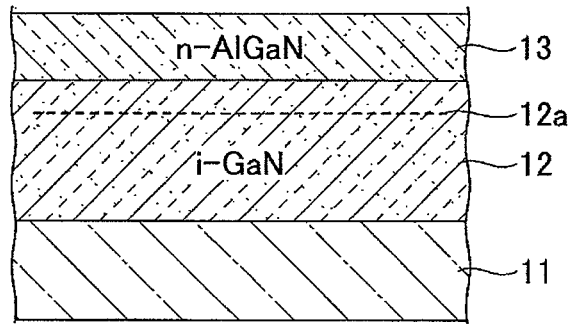
FIGS. 19A-21B are schematic diagrams for describing a method for manufacturing a semiconductor apparatus according to a fifth embodiment of the present invention.

As illustrated in FIG. 19A, the electron transit layer (first semiconductor layer) 12 and the electron supply layer (second semiconductor layer) 13 are sequentially formed on the substrate 11 formed of a semi-insulating material (e.g., SiC). In this embodiment, the electron transit layer 12 and the electron supply layer 13 are formed by epitaxial growth based on Metalorganic vapour phase epitaxy (MOVPE). It is to be noted that, in this embodiment, the electron transit layer 12 is formed with i-GaN having a thickness of approximately 3 μm. Further, the electron supply layer 13 is formed with n-AlGaN having a thickness of approximately 30 nm. The electron supply layer 13 is doped with an impurity element such as Si, so that the impurity concentration of the electron supply layer 13 is $5\times10^{18}$ cm$^{-3}$. Thereby, the 2DEG layer 12a is formed in the electron transit layer 12 at the vicinity of the interface between the electron transit layer 12 and the electron supply layer 13. Then, although not illustrated in the drawings, an element separation region is formed. In forming the element separation region, first, photoresist is coated on a predetermined region(s) of the surface of the layered configuration. Then, the photoresist is developed by being exposed with an exposing device. Thereby, a resist pattern is formed having an opening at a region where the element separation region is to be formed. Then, the element separation region can be obtained by forming an insulation film or by injecting ions containing a predetermined chemical element in a dry-etched region. A gas containing a chlorine component is used for forming the dry-etched region.

Figure 19B:
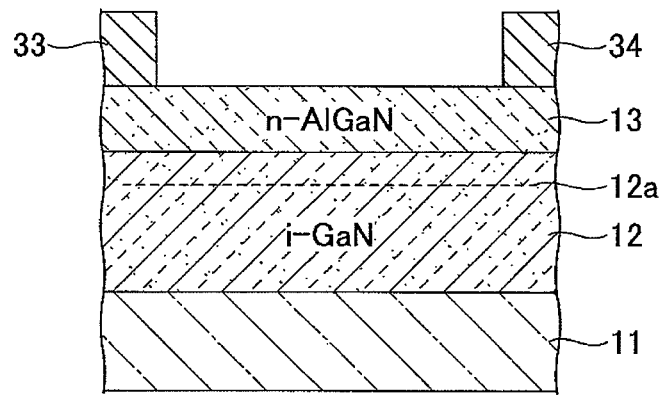

Then, as illustrated in FIG. 19B, the source electrode 33 and the drain electrode 34 are formed. More specifically, a resist pattern (not illustrated) having openings at regions where the source and drain electrodes 33, 34 are to be formed is formed by applying photoresist on the surface of the electron supply layer 13 and developing the photoresist by exposing the photoresist with an exposing device. Then, a metal film is formed by sequentially depositing a Ta film having a thickness of approximately 20 nm and an Al film having a thickness of approximately 200 nm. The Ta film and the Al film are deposited by vacuum deposition. Then, the metal film on the resist pattern is removed together with the resist pattern by performing lift-off using an organic solvent or the like. Thereby, the metal film deposited on regions having no resist pattern formed thereon remains on the electron supply layer 13. Accordingly, the remaining metal film becomes the source electrode 33 and the drain electrode 34. Then, a thermal process is performed on the source electrode 33 and the drain electrode 34 at a temperature of 400° C. to 1000° C. (e.g., 550° C.). Thereby, ohmic contact is established between the source electrode 33 and the drain electrode 34.

Figure 19C:
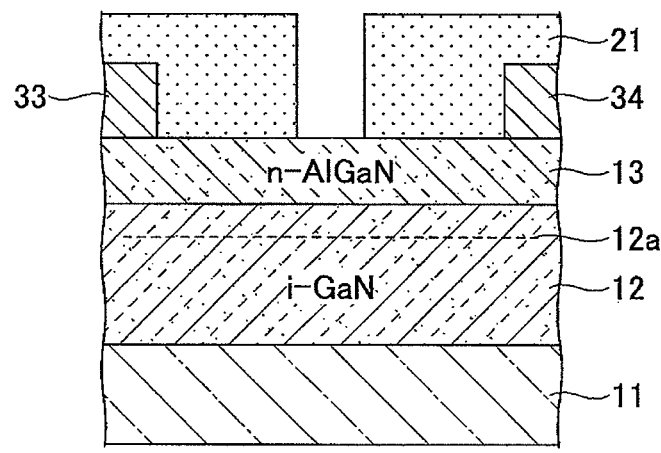

Then, as illustrated in FIG. 19C, the resist pattern 21 is formed on the source electrode 33, the drain electrode 34, and the surface of the electron supply layer 13. The resist pattern 21 is formed by coating photoresist on the surface of the electron supply layer 13 (formed of n-AlGaN) and developing the photoresist by exposing the photoresist with an exposing device. Thereby, the resist pattern 21 can be formed having an opening(s) formed in a region where the gate recess 22 is to be formed.

Figure 20A:
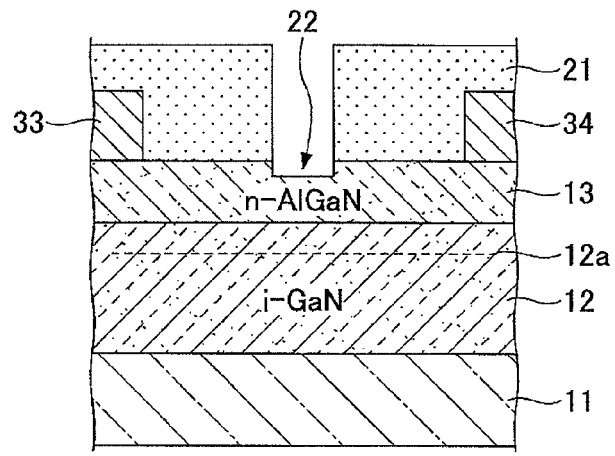

Then, as illustrated in FIG. 20A, a part of or all of the electron supply layer 13 having no resist pattern 21 formed thereon is removed by dry etching (e.g., RIE (Reactive Ion Etching)). Thereby, the gate recess 22 is formed. The etching gas used in the dry etching contains a mixture of a chlorine type gas (gas containing a chlorine component) and a fluorine type gas (gas containing a fluorine component) that are mixed by being guided into a dry-etching chamber of a dry-etching apparatus. In this embodiment, the gate recess 22 is formed by guiding an etching gas containing $Cl_2$ of 20 sccm and $SF_6$ of 10 sccm into the etching chamber, setting the pressure inside the etching chamber to 2 Pa, and performing RIE with RF (Radio Frequency) power of 20 W.

Figure 20B:
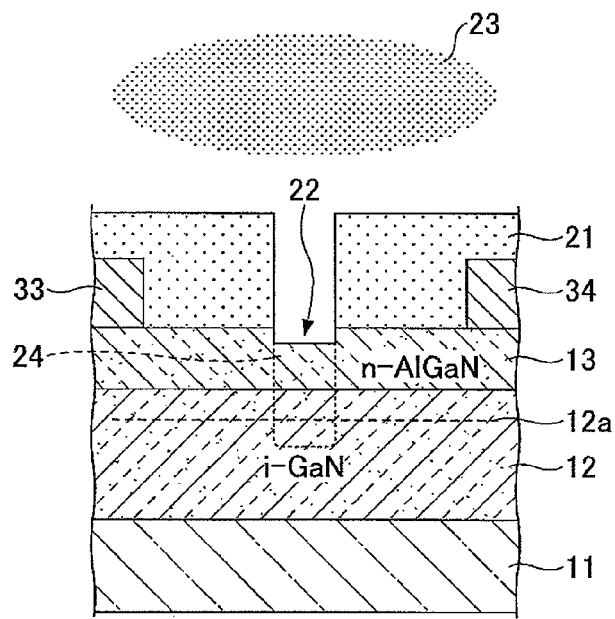

Then, as illustrated in FIG. 20B, fluorine is injected into the part of the electron transit layer 12 and the part of the electron supply layer 13 that correspond to the region in which the gate recess 22 is formed by performing a plasma process using fluorine. More specifically, the plasma process is performed by guiding a gas containing a fluorine component (e.g., $SF_6$, $CF_4$, $C_2F_6$, $C_3F_8$, $CHF_3$, $NF_3$, or $F_2$) into the etching chamber of the above-described dry-etching apparatus (used for RIE) and generating fluoride plasma 23 by applying predetermined RF power. Thereby, the fluorine containing region 24 is formed in the part of the electron transit layer 12 and the part of the electron supply layer 13 that correspond to the region in which the gate recess 22 is formed. The forming of the fluorine containing region 24 causes reduction of the number of electrons in the part of the 2DEG layer 12a directly below the region in which the gate recess 22 is formed. In this embodiment, the fluorine containing region 24 is formed by guiding an etching gas containing $CF_4$ of 30 sccm into the etching chamber, setting the pressure inside the etching chamber to 2 Pa, and generating fluoride plasma 23 by applying RF (Radio Frequency) power of 200 W.

Figure 20C:
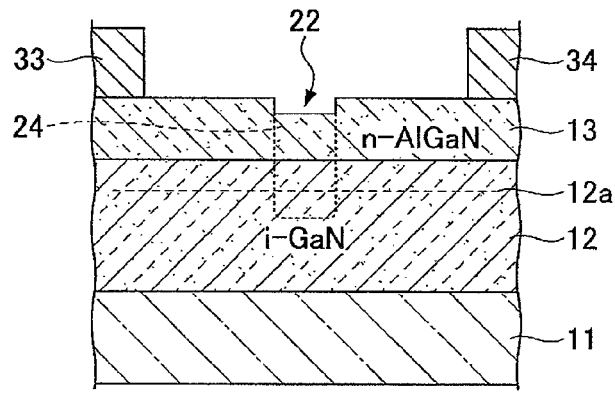

Then, as illustrated in FIG. 20C, the resist pattern 21 is removed by using, for example, an organic solvent.

Figure 21A:
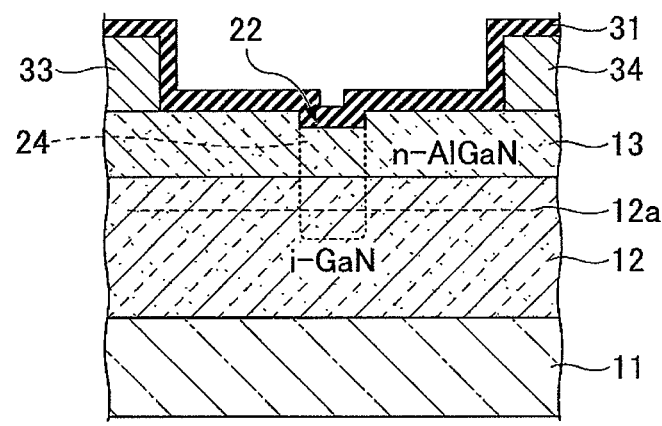

Then, as illustrated in FIG. 21A, the insulation film 31 is formed on the gate recess 22 and the electron supply layer 13. The insulation film 31 is to serve as a gate insulation film. In this embodiment, the insulation film 31 is formed by depositing an aluminum oxide film ($Al_2O_3$) having a thickness of 2 nm-200 nm. More specifically, the insulation film 31 is formed by depositing an aluminum oxide film having a thickness of approximately 10 nm.

Figure 21B:
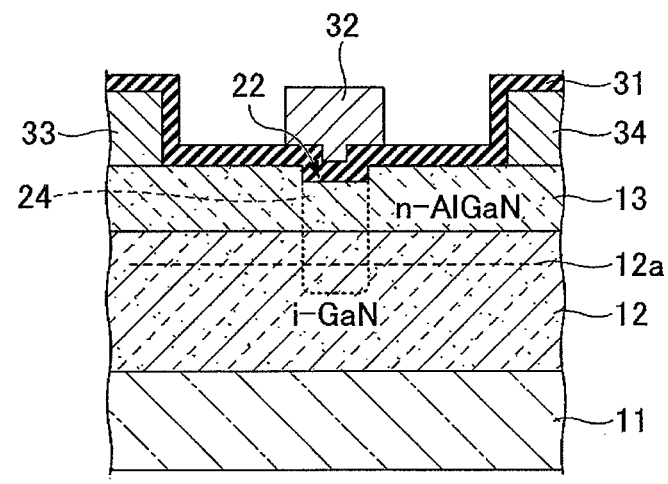

Then, as illustrated in FIG. 21B, the gate electrode 32 is formed on the region where the gate recess 22 is formed via the insulation film 31. More specifically, a resist pattern having an opening at a region where the gate electrode 32 is to be formed is formed by applying photoresist on the insulation film 31 and developing the photoresist by exposing the photoresist with an exposing device. Then, a metal film is formed by sequentially depositing a Ni film having a thickness of approximately 30 nm and an Au film having a thickness of approximately 400 nm. The Ni film and the Au film are deposited by vacuum deposition. Then, the metal film on the resist pattern is removed together with the resist pattern by performing lift-off using an organic solvent or the like. Thereby, the metal film deposited on a region having no resist pattern formed thereon remains on the insulation film 31 and the gate recess 22. Accordingly, the remaining metal film becomes the gate electrode 32.

Hence, the semiconductor apparatus 100 can also be obtained with the above-described embodiment of the method for manufacturing a semiconductor apparatus. Details of the fifth embodiment are substantially the same as those of the first embodiment except for the above-described details of the fifth embodiment.

Sixth Embodiment

Figure 22:
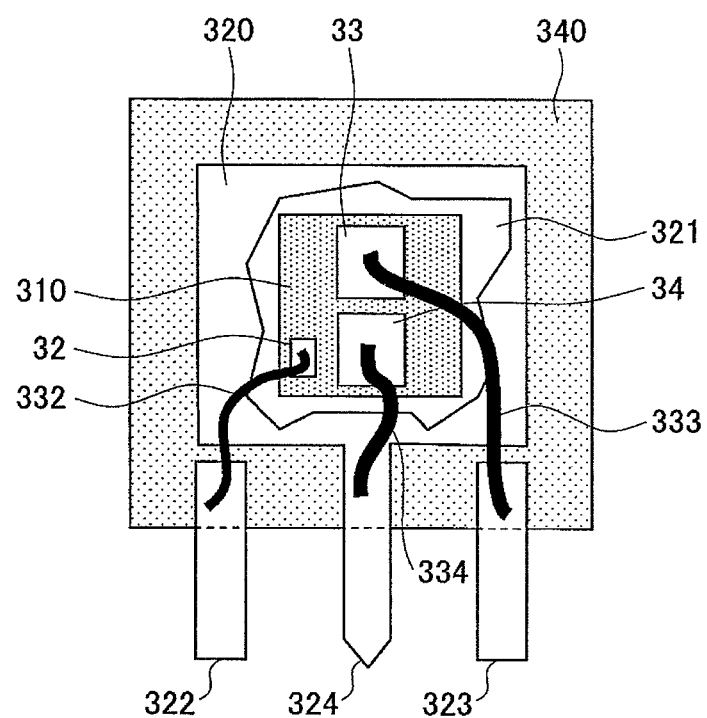
FIG. 22 is a schematic diagram illustrating a discretely packaged semiconductor device according to a sixth embodiment of the present invention.

With reference to FIG. 22, the following embodiment describes a case where the semiconductor apparatus 100-400 manufactured by the above-described first-fifth embodiments is discretely packaged. FIG. 22 is a schematic diagram illustrating the inside of a discretely packaged semiconductor device according to an embodiment of the present invention. It is to be noted that aspects regarding the configuration of the semiconductor device of the sixth embodiment (e.g., arrangement of electrodes) is not the same as that of the first-fifth embodiments.

First, a semiconductor chip 310 including a HEMT formed of a GaN type semiconductor material is obtained by dicing the semiconductor apparatus 100-400 according to the first to fifth embodiments of the present invention. The semiconductor chip 310 is fixed to a lead frame 320 by a die-attach agent 321 (e.g., solder).

Then, the gate electrode 32 is connected to a gate lead 322 by a bonding wire 332. The source electrode 323 is connected to a source lead 323 by a bonding wire 333. The drain electrode is connected to a drain lead 324 by a bonding wire 334. It is to be noted that the bonding wires 332, 333, 334 are formed of a metal material such as aluminum (Al).

Then, the semiconductor chip 310 is sealed with a molding resin 340 by using a transfer molding method. Thereby, a semiconductor device having a discretely packaged HEMT formed of a GaN type semiconductor material can be manufactured.

Figure 23:
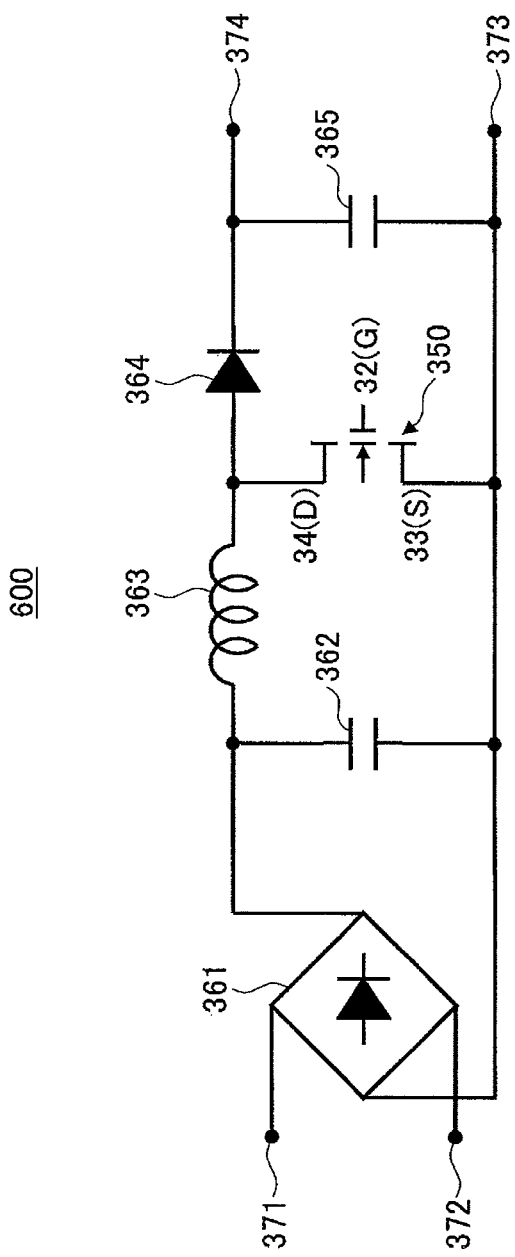
FIG. 23 is a circuit diagram illustrating a PFC (Power Factor Correction) circuit according to the sixth embodiment of the present invention.

Next, a PFC (Power Factor Correction) circuit 600 using a HEMT 350 formed of a GaN type semiconductor material of the semiconductor apparatuses 100-400 of the first-fifth embodiments is described with reference to FIG. 23. The PFC 600 is formed on a circuit board (not illustrated). Other than the HEMT 350, the PFC 600 includes a diode bridge 361, a first capacitor 362, a choke coil 363, a diode 364, and a second capacitor 365. The input side of the diode bridge 361 is connected to an AC (Alternating Current) power supply via input terminals 371, 372. A first terminal of the output side of the diode bridge 361 is connected to a first terminal of the first capacitor 362, the source voltage 33 (S) of the HEMT 350, a first terminal of the second capacitor 365, and an output terminal 373. Further, a second terminal of the output side of the diode bridge 361 is connected to a second terminal of the first capacitor 362 and a first terminal of the choke coil 363. A second terminal of the choke coil 363 is connected to the drain electrode 34 (D) of the HEMT 350 and an anode terminal of the diode 364. A cathode terminal of the diode 364 is connected to the second terminal of the second capacitor 365, and an output terminal 374. It is to be noted that the gate electrode (G) of the HEMT 350 is connected to a gate driver (not illustrated). Thereby, the PFC circuit 600 can obtain a DC (Direct Current) voltage via the output terminals 373, 374. The PFC circuit 600 is installed and used in, for example, a power supply of a server. By using the PFC circuit 600, harmonic components can be eliminated and power factor can be increased.

Hence, the PFC circuit 600 according to the sixth embodiment enables power to be reliably, steadily supplied at low cost owing to the use of the semiconductor apparatuses 100-400 of the first-fifth embodiments having consistent characteristics and high yield.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor apparatus comprising:
   a first semiconductor layer formed on a substrate;
   a second semiconductor layer formed on the first semiconductor layer;
   a gate recess formed by removing at least a portion of the second semiconductor layer;
   an insulation film formed on the gate recess and the second semiconductor layer;
   a gate electrode formed on the gate recess via the insulation film;
   source and drain electrodes formed on one of the first and the second semiconductor layers; and
   a fluorine containing region formed in at least one of a part of the first semiconductor layer corresponding to a region in which the gate recess is formed and a part of the second semiconductor layer corresponding to the region in which the gate recess is formed;
   wherein the first semiconductor layer is an electron transit layer, and the second semiconductor layer is an electron supply layer.

2. The semiconductor apparatus as claimed in claim 1, wherein the insulation film includes one or more of an oxide, a nitride, or an oxynitride of Si, Al, Hf, Zr, Ti, Ta, and W.

3. The semiconductor apparatus as claimed in claim 1, wherein the semiconductor apparatus is a HEMT (High Electron Mobility Transistor).

4. A semiconductor apparatus comprising:
   a first semiconductor layer formed on a substrate;
   a second semiconductor layer formed on the first semiconductor layer;
   a third semiconductor layer formed on the second semiconductor layer;
   a gate recess formed by removing at least a portion of the third semiconductor layer;

an insulation film formed on the gate recess and the third semiconductor layer;

a gate electrode formed on the gate recess via the insulation film;

source and drain electrodes formed on one of the first and the second semiconductor layers; and a fluorine containing region formed in at least one of a part of the first semiconductor layer corresponding to a region in which the gate recess is formed, a part of the second semiconductor layer corresponding to the region in which the gate recess is formed, and a part of the third semiconductor layer corresponding to the region in which the gate recess is formed;

wherein the third semiconductor layer is formed on the second semiconductor layer via an n-GaN layer formed on the second semiconductor layer and an AlN layer formed on the n-GaN layer.

5. The semiconductor apparatus as claimed in claim 4, wherein the gate recess is formed by removing at least a part of the second semiconductor layer and all of the third semiconductor layer of a predetermined region of the third semiconductor layer.

6. The semiconductor apparatus as claimed in claim 4, wherein the first and the second semiconductor layers are formed of a nitride semiconductor.

7. The semiconductor apparatus as claimed in claim 6, wherein the first semiconductor layer includes i-GaN.

8. The semiconductor apparatus as claimed in claim 6, wherein the second semiconductor layer includes AlGaN or InAlN.

* * * * *